(12) United States Patent
Koiwa

(10) Patent No.: US 10,665,491 B2
(45) Date of Patent: May 26, 2020

(54) PROCESSING APPARATUS FOR THERMALLY PROCESSING A WORKPIECE IN A CHAMBER

(71) Applicant: TOKYO ELECTRON LIMITED, Tokyo (JP)

(72) Inventor: Shingo Koiwa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 353 days.

(21) Appl. No.: 15/459,028

(22) Filed: Mar. 15, 2017

(65) Prior Publication Data

US 2017/0278737 A1 Sep. 28, 2017

(30) Foreign Application Priority Data

Mar. 22, 2016 (JP) .................. 2016-056940

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32192* (2013.01); *H01J 37/32697* (2013.01); *H01J 37/32715* (2013.01); *H01J 37/32724* (2013.01); *H01L 21/67103* (2013.01); *H01L 21/67109* (2013.01); *H01L 21/6831* (2013.01); *H01J 2237/32* (2013.01)

(58) Field of Classification Search
CPC ......... C30B 25/00; C30B 25/02; C30B 25/10; C30B 25/12; H01L 21/67; H01L 21/68; H01L 21/683; H01L 21/6831; H01L 21/6833; H01L 21/67103; H01L 21/67109; H01J 37/32192; H01J 37/32697; H01J 37/32715; H01J 37/32724; H01J 2237/32
USPC ............... 117/200–202, 204; 118/715, 722, 118/724–725, 728; 156/345.1, 345.51, 156/345.52, 345.53
See application file for complete search history.

(56) References Cited

U.S. PATENT DOCUMENTS

| | | | | |
|---|---|---|---|---|
| 5,567,267 | A | * | 10/1996 | Kazama .................. H01J 37/32 156/345.27 |
| 2011/0186545 | A1 | * | 8/2011 | Mahadeswaraswamy .................. H01J 37/32935 216/59 |
| 2014/0319121 | A1 | * | 10/2014 | Kim .................. H01L 21/67109 219/444.1 |

(Continued)

FOREIGN PATENT DOCUMENTS

| JP | 2003-249541 A | 9/2003 |
|---|---|---|
| JP | 2006-261541 A | 9/2006 |

(Continued)

*Primary Examiner* — Kenneth A Bratland, Jr.
(74) *Attorney, Agent, or Firm* — Studebaker & Backett PC

(57) ABSTRACT

A processing apparatus has a pedestal which includes an electrostatic chuck and a cooling table. A plurality of heat transfer spaces are provided between the electrostatic chuck and the cooling table. The plurality of heat transfer spaces are coaxially provided with respect to the center axis of the electrostatic chuck and are separated from each other. The processing apparatus further includes a piping system. The piping system is configured to selectively connect each of the plurality of heat transfer spaces to a chiller unit, a source of a heat transfer gas, and an exhaust device.

15 Claims, 20 Drawing Sheets

(56) References Cited

U.S. PATENT DOCUMENTS

2015/0060013 A1* 3/2015 Buchberger, Jr. ............................ H01J 37/32724
 165/64

FOREIGN PATENT DOCUMENTS

| JP | 2006-526289 A | 11/2006 |
|---|---|---|
| JP | 5482282 B2 | 5/2014 |
| WO | 2004/095531 A2 | 11/2004 |

* cited by examiner

PROCESSING APPARATUS FOR THERMALLY PROCESSING A WORKPIECE IN A CHAMBER

CROSS-REFERENCE TO RELATED APPLICATIONS

This application is based on and claims the benefit of priority from Japanese Patent Application No. 2016-056940 filed on Mar. 22, 2016, the entire contents of which is incorporated herein by reference.

FIELD

Exemplary embodiments of the present disclosure relate to a processing apparatus for processing a workpiece in a chamber.

BACKGROUND

In manufacturing of an electronic device such as a semiconductor device, a processing apparatus is used. In general, the processing apparatus includes a chamber body, a pedestal, and a gas supply portion. The pedestal is provided in the chamber body. The pedestal includes a main body on which a workpiece is to be placed, and a cooling table in which a passage for a refrigerant is formed therein. The main body is provided on the cooling table. In addition, a heater is built in the main body. The gas supply portion supplies gas for processing a workpiece into the chamber body.

In processing of the workpiece using the processing apparatus, the temperature of the workpiece may be set to a high temperature over, for example, 200° C. To this end, a pedestal having a structure which increases thermal insulation properties between the cooling table and the main body is proposed in Japanese Patent No. 5482282.

The pedestal described in Japanese Patent No. 5482282 includes a plurality of thermal insulation members in addition to the cooling table and the main body. The thermal insulation members are provided between the cooling table and the main body. Accordingly, in the pedestal described in Japanese Patent No. 5482282, the thermal insulation members and spaces provided between the thermal insulation members are interposed between the cooling table and the main body. Therefore, it is possible to set the temperature of the main body to a high temperature.

Meanwhile, in a pedestal, an electrostatic chuck may be provided on a cooling table. In general, the cooling table and the electrostatic chuck are bonded to each other by an adhesive agent. In such a pedestal, a distribution of a temperature of the electrostatic chuck is required to be adjusted in a radial direction with respect to the center axis of the electrostatic chuck. To this end, typically, a plurality of heaters are coaxially provided within the electrostatic chuck.

In the pedestal, a range of a settable temperature of the electrostatic chuck is narrow. In addition, a range of a settable temperature increase rate of the electrostatic chuck and a range of a settable temperature decrease rate of the electrostatic chuck are also narrow. Further, it is difficult to set a temperature distribution which greatly varies in the radial direction with respect to the electrostatic chuck.

SUMMARY

In one aspect, there is provided a processing apparatus for a workpiece. The processing apparatus includes a chamber body and a pedestal. The pedestal is provided inside the chamber body. The pedestal includes a metal cooling table and an electrostatic chuck. A passage for a refrigerant is formed in the cooling table. The electrostatic chuck is provided above the cooling table. The electrostatic chuck includes a plurality of regions which are coaxial with respect to a center axis of the electrostatic chuck. A plurality of heaters are provided in the plurality of regions, respectively. A plurality of heat transfer spaces are provided between the cooling table and the electrostatic chuck. The plurality of heat transfer spaces extend below the plurality of regions, respectively and are separated from each other. The processing apparatus further includes a heater power source and a piping system. The plurality of heaters are connected to the heater power source. The piping system includes a plurality of valves which selectively connect a chiller unit, a gas source of a heat transfer gas, and an exhaust device to each of the plurality of heat transfer spaces and switch connection and disconnection between the chiller unit and the passage of the cooling table.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
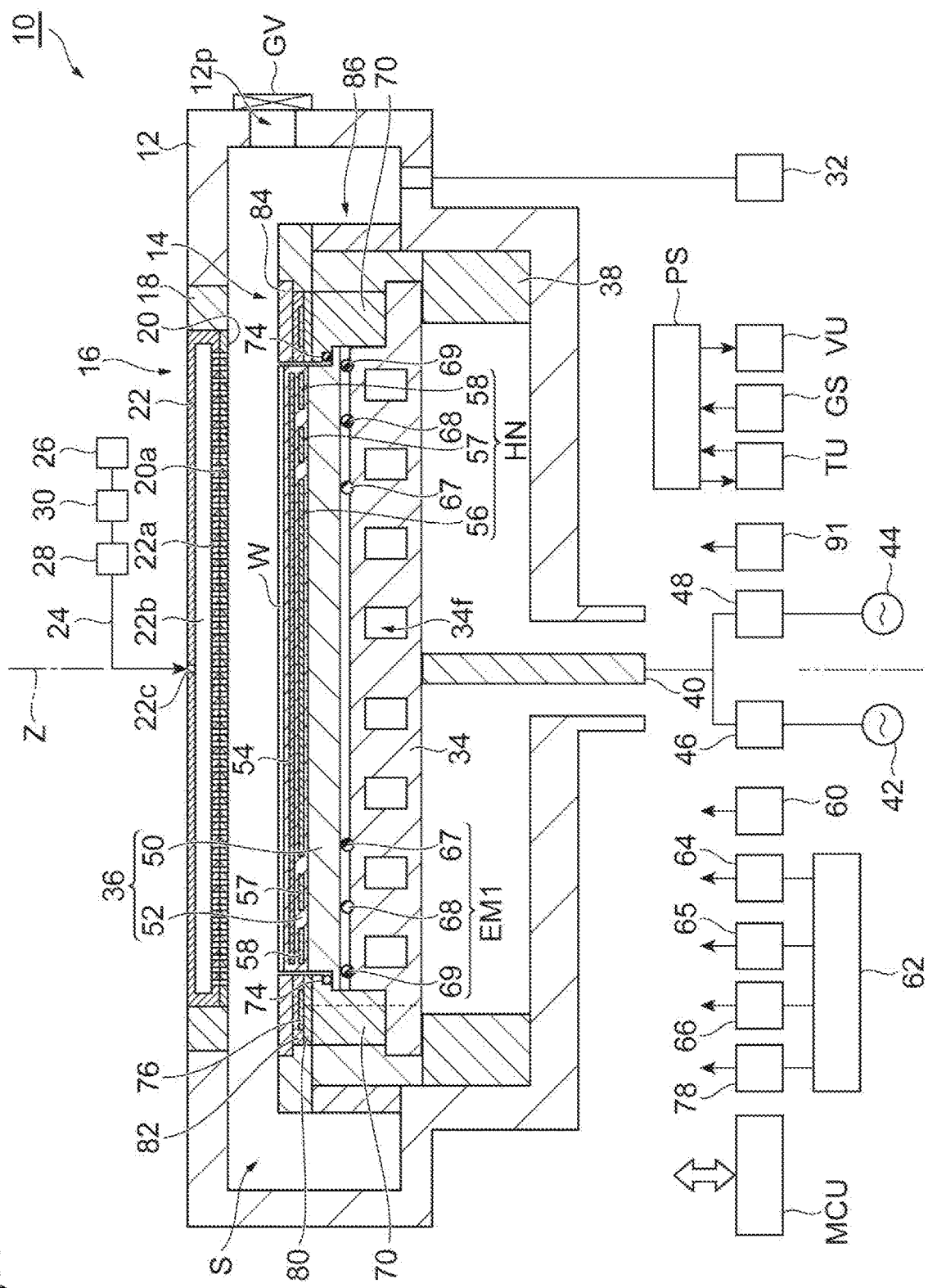
FIG. 1 is a view schematically illustrating a processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In one aspect, there is provided a processing apparatus for a workpiece. The processing apparatus includes a chamber body and a pedestal. The pedestal is provided inside the chamber body. The pedestal includes a metal cooling table and an electrostatic chuck. A passage for a refrigerant is formed in the cooling table. The electrostatic chuck is provided above the cooling table. The electrostatic chuck includes a plurality of regions which are coaxial with respect to a center axis of the electrostatic chuck. A plurality of heaters are provided in the plurality of regions, respectively. A plurality of heat transfer spaces are provided between the cooling table and the electrostatic chuck. The plurality of heat transfer spaces extend below the plurality of regions, respectively and are separated from each other. The processing apparatus further includes a heater power source and a piping system. The plurality of heaters are connected to the heater power source. The piping system includes a plurality of valves which selectively connect a chiller unit, a gas source of a heat transfer gas, and an exhaust device to each of the plurality of heat transfer spaces and switch connection and disconnection between the chiller unit and the passage of the cooling table.

In the processing apparatus according to the aspect, each of the heat transfer spaces may be depressurized, the heat transfer gas may be supplied to each of the heat transfer spaces, or a refrigerant may be supplied from the chiller unit to each of the heat transfer spaces. Accordingly, a thermal resistance between the cooling table and the electrostatic chuck can be changed. Therefore, a range of a settable temperature of the electrostatic chuck is wide. In addition, a range of a settable temperature increase rate and a range of a settable temperature decrease rate of the electrostatic chuck are also wide. In addition, by generating differences between the thermal resistances of the heat transfer spaces, it is possible to set a temperature distribution, which greatly varies in the radial direction, with respect to the electrostatic chuck. Further, since it is possible to adjust the thermal resistance of each of the heat transfer spaces, it is possible to set various temperature distributions with respect to the electrostatic chuck. For example, a temperature distribution which steeply varies in the radial direction, a temperature distribution which gently varies in the radial direction, or a temperature distribution which is substantially constant in the radial direction can be set with respect to the electrostatic chuck. In addition, since it is possible to increase the thermal resistance between the cooling table and the electrostatic chuck, it is possible to decrease power supplied to the heaters.

In an exemplary embodiment, the processing apparatus further includes a controller. The controller is configured to control the plurality of valves and the heater power source. The plurality of regions of the electrostatic chuck include a first region, a second region, and a third region. The first region intersects the center axis of the electrostatic chuck, the third region is a region which includes an edge of the electrostatic chuck, and the second region is provided between the first region and the third region. The plurality of heaters include a first heater provided in the first region, a second heater provided in the second region, and a third heater provided in the third region. The plurality of heat transfer spaces includes a first heat transfer space provided below the first region, a second heat transfer space provided below the second region, and a third heat transfer space provided below the third region.

In an exemplary embodiment, the controller may control the heater power source to supply power to the plurality of heaters, and may control the plurality of valves to circulate a refrigerant between the passage of the cooling table and the chiller unit and connect the plurality of heat transfer spaces to the gas source. The control of this embodiment can be used when the temperature of the electrostatic chuck is set to a high temperature and the temperature distribution of the electrostatic chuck in the radial direction is set to be substantially constant. In addition, the control of this embodiment can be used when the temperature of the electrostatic chuck is increased at a relatively low temperature increase rate.

In an exemplary embodiment, the controller may control the heater power source such that a heating value of the first heater and a heating value of the second heater are greater than a heating value of the third heater, and may control the plurality of valves to circulate the refrigerant between the passage of the cooling table and the chiller unit, connect the first heat transfer space and the second heat transfer space to the gas source, and connect the third heat transfer space to the chiller unit. The control of this embodiment can be used when the temperature of the electrostatic chuck is set to a high temperature and the temperature distribution in which the temperature gently decreases as approaching the edge of the electrostatic chuck is set to the electrostatic chuck.

In an exemplary embodiment, the controller may control the heater power source such that a heating value of the second heater is greater than a heating value of the first heater and the heating value of the first heater is greater than a heating value of the third heater, and may control the plurality of valves to circulate the refrigerant between the passage of the cooling table and the chiller unit, connect the first heat transfer space and the second heat transfer space to the gas source, and connect the third heat transfer space to the chiller unit. The control of this embodiment can be used when the temperature of the electrostatic chuck is set to a high temperature and the temperature distribution in which the temperature steeply decreases in a region including the edge is set to the electrostatic chuck.

In an exemplary embodiment, the controller may control the heater power source to supply power to the plurality of heaters, and may control the plurality of valves to connect the plurality of heat transfer spaces to the chiller unit. The control of this embodiment can be used when the temperature of the electrostatic chuck is set to a low temperature and the temperature distribution of the electrostatic chuck in the radial direction is set to be substantially constant.

In an exemplary embodiment, the controller may control the heater power source such that a heating value of the first heater and a heating value of the second heater are greater than a heating value of the third heater, and may control the plurality of valves to connect the plurality of heat transfer spaces to the chiller unit. The control of this embodiment can be used when the temperature of the electrostatic chuck is set to a low temperature and the temperature distribution in which the temperature gently decreases as approaching the edge of the electrostatic chuck is set to the electrostatic chuck.

In an exemplary embodiment, the controller may control the heater power source to supply power to the plurality of heaters, and may control the plurality of valves to circulate the refrigerant between the passage of the cooling table and the chiller unit and connect the plurality of heat transfer spaces to the exhaust device. The control of this embodiment can be used when the temperature of the electrostatic chuck is increased at a relatively high temperature increase rate.

In an exemplary embodiment, the controller may control the heater power source to shut-off supplying of power to the plurality of heaters, and may control the plurality of valves to circulate the refrigerant between the passage of the cooling table and the chiller unit and connect the plurality of heat transfer spaces to the gas source. The control of this embodiment can be used when the temperature of the electrostatic chuck is decreased at a relatively low temperature increase rate.

In an exemplary embodiment, the controller may control the heater power source to shut-off supplying of power to the plurality of heaters, and may control the plurality of valves to circulate the refrigerant between the passage of the cooling table and the chiller unit and connect the plurality of heat transfer spaces to the chiller unit. The control of this embodiment can be used when the temperature of the electrostatic chuck is decreased at a relatively high temperature decrease rate.

In an exemplary embodiment, the electrostatic chuck includes a conductive base and an attracting portion made of ceramics. The attracting portion is provided on the base and the plurality of heaters are built in the attracting portion. The processing apparatus further include a high-frequency power source electrically connected to the base, and a gas supply unit which supplies a processing gas to the inside of the chamber body. The processing apparatus of this embodiment can be used as a plasma processing apparatus.

Hereinafter, various embodiments will be described in detail with reference to the drawings. In the drawing, the same or equivalent portions are denoted by the same reference symbols.

FIG. 1 is a view schematically illustrating a processing apparatus according to an exemplary embodiment. A processing apparatus 10 shown in FIG. 1 is a capacitive coupling plasma processing apparatus. The processing apparatus 10 includes a chamber body 12 and a pedestal 14. The chamber body 12 has a substantially cylindrical shape, and the internal space of the chamber body 12 is provided as a chamber S. The chamber body 12 is formed of, for example, aluminum. An alumite film and/or a film made of a ceramic having plasma resistance, such as yttrium oxide, is formed on the surface of the internal space side of the chamber body 12. The chamber body 12 is grounded. In addition, an opening 12p, through which a workpiece W is transferred into the chamber S and is transferred out from the chamber S, is formed in a side wall of the chamber body 12. This opening 12p can be opened and closed by a gate valve GV. The workpiece W has a disk shape such as a wafer.

The pedestal 14 is configured to support the workpiece W in the chamber S. The pedestal 14 has a function which attracts the workpiece W, a function which adjusts the temperature of the workpiece W, and a structure in which a high frequency wave is transmitted to a base of an electrostatic chuck. This pedestal 14 will be described in detail below.

The processing apparatus 10 further includes an upper electrode 16. The upper electrode 16 is disposed in an upper opening of the chamber body 12, and is disposed to be substantially parallel with a lower electrode of the pedestal 14 described below. An insulating support member 18 is interposed between the upper electrode 16 and the chamber body 12.

The upper electrode 16 includes a top plate 20 and a support 22. The top plate 20 has a substantially disk shape. The top plate 20 may have conductivity. The top plate 20 is formed of, for example, silicon. Alternatively, the top plate 20 is formed of aluminum, and a ceramic film having a plasma resistance is formed on the surface of the top plate 20. A plurality of gas discharging holes 20a are formed in the top plate 20. The gas discharging holes 20a extend in a substantially vertical direction.

The support 22 detachably supports the top plate 20. The support 22 is formed of, for example, aluminum. A gas diffusion chamber 22b is formed in the support 22. A plurality of communication holes 22a which communicate with the gas discharging holes 20a extends from the gas diffusion chamber 22b. In addition, a pipe 24 is connected to the gas diffusion chamber 22b via a port 22c. A gas source 26 is connected to the pipe 24. In addition, a flow-rate controller 28 such as a mass flow controller and a valve 30 are provided midway in the pipe 24. The gas source 26, the flow-rate controller 28, and the valve 30 configure a gas supply unit in the embodiment.

The processing apparatus 10 further includes an exhaust device 32. The exhaust device 32 includes one or more pumps, such as a turbo molecule pump and/or a dry pump, and a pressure adjustment valve. The exhaust device 32 is connected to an exhaust port which is formed in the chamber body 12.

The processing apparatus 10 further includes a controller MCU. The controller MCU is configured to control each portion of the processing apparatus 10. For example, the controller MCU may be a computer device which includes a processor and a storage unit such as a memory. The controller MCU is operated according to a program and a recipe stored in the storage unit to control each portion of the processing apparatus 10.

When the processing apparatus 10 is used, the workpiece W is placed on the pedestal 14 and is held by the pedestal 14. In addition, a processing gas is supplied from the gas source 26 into the chamber body 12, and the exhaust device 32 is operated to decrease a pressure of a space inside the chamber body 12. In addition, a high-frequency electric field is formed between the upper electrode 16 and the pedestal 14. Accordingly, the processing gas is dissociated, and the workpiece W is processed by activated species of molecules and/or atoms in the processing gas. In such processing, each portion of the processing apparatus 10 is controlled by the controller MCU.

Figure 2:
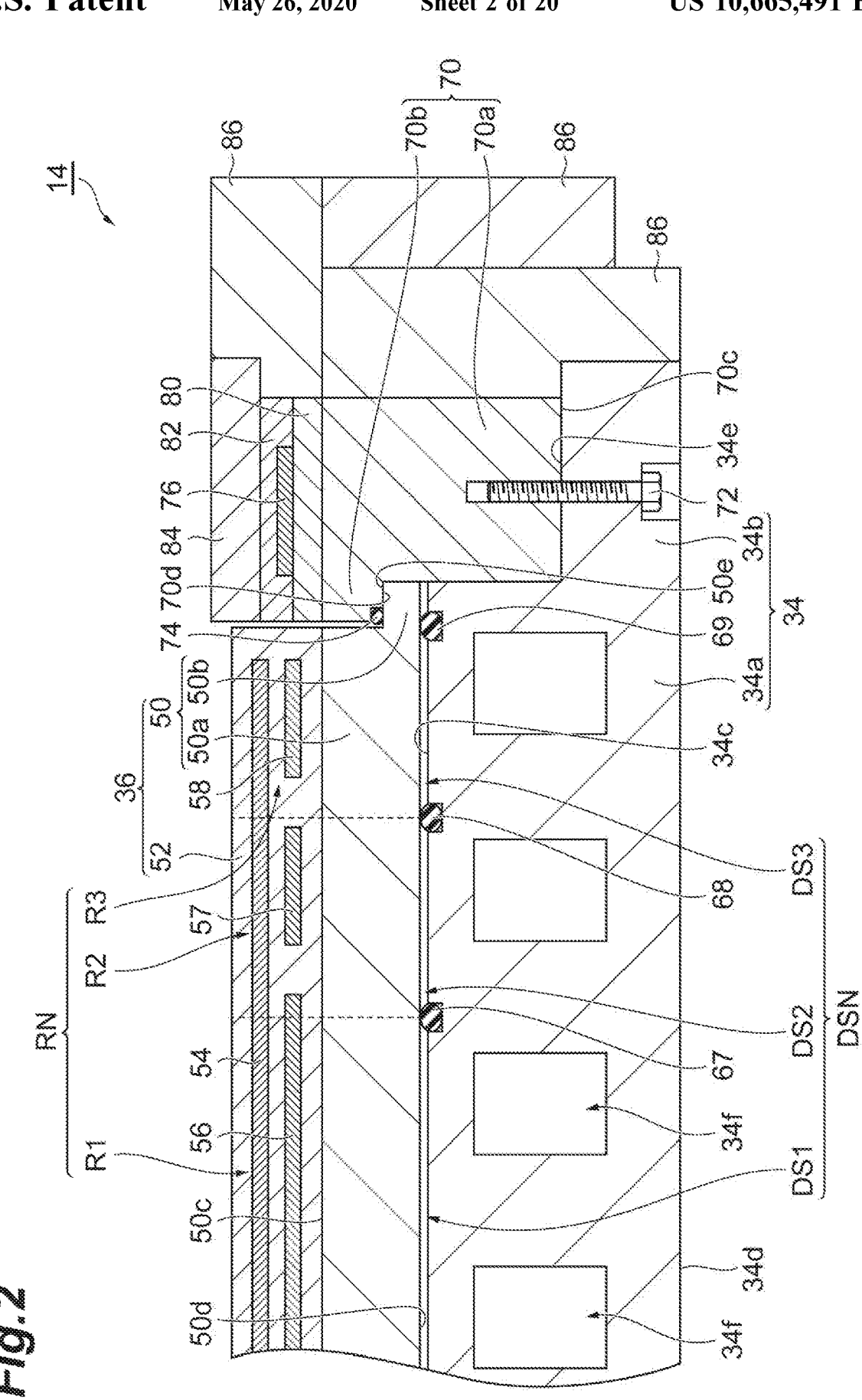
FIG. 2 is an enlarged sectional view illustrating a portion of a pedestal of the processing apparatus shown in FIG. 1.
Figure 3:
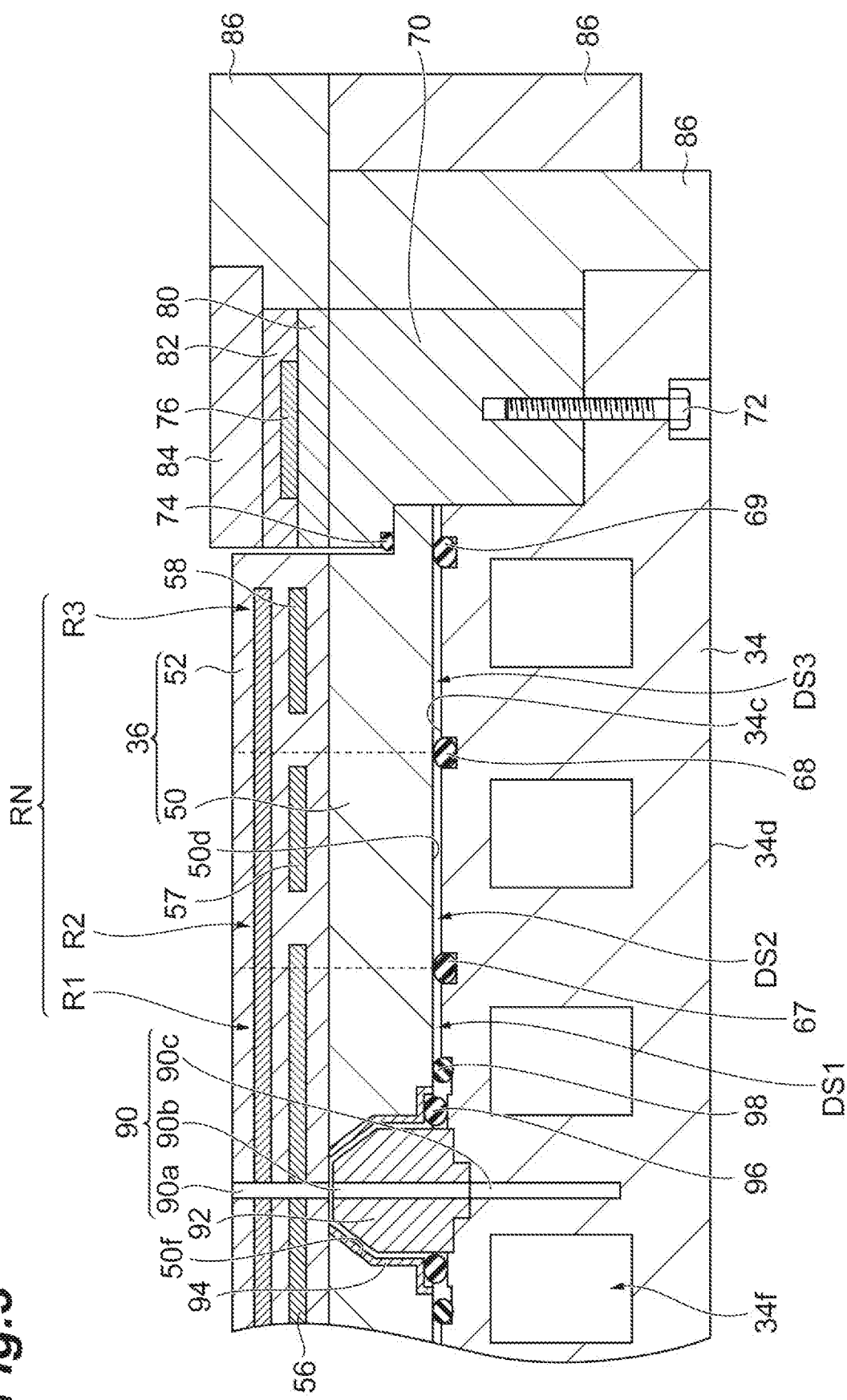
FIG. 3 is an enlarged sectional view illustrating another portion of the pedestal of the processing apparatus shown in FIG. 1.

Hereinafter, the pedestal 14 and components of the processing apparatus 10 associated with the pedestal 14 will be described in detail with reference to FIGS. 2 and 3 in addition to the FIG. 1. FIG. 2 is an enlarged sectional view illustrating a portion of the pedestal of the processing apparatus shown in FIG. 1. FIG. 3 is an enlarged sectional view illustrating another portion of the pedestal of the processing apparatus shown in FIG. 1.

The pedestal 14 includes a cooling table 34 and an electrostatic chuck 36. The cooling table 34 is supported by a support member 38 which extends upward from the bottom portion of the chamber body 12. The support member 38 is an insulating member, and is formed of, for example, aluminum oxide (alumina). In addition, the support member 38 has a substantially cylindrical shape.

The cooling table 34 is formed of metal having conductivity, for example, aluminum. The cooling table 34 has a substantially disk shape. The cooling table 34 includes a center portion 34a and a peripheral portion 34b. The center portion 34a has a substantially disk shape. The center portion 34a provides a first upper surface 34c of the cooling table 34. The first upper surface 34c is a substantially circular surface.

The peripheral portion 34b is continued to the center portion 34a, and extends on the outside of the center portion 34a in a radial direction (i.e. a radial direction with respect to the axis Z extending in the vertical direction) and along a circumferential direction (a circumferential direction with respect to an axis Z). In one embodiment, the peripheral portion 34b provides a lower surface 34d of the cooling table 34 along with the center portion 34a. In addition, the peripheral portion 34b provides a second upper surface 34e. The second upper surface 34e is a band-shaped surface, is positioned on the outside of the first upper surface 34c in the radial direction, and extends in the circumferential direction. In addition, the second upper surface 34e is positioned to be closer to the lower surface 34d than the first upper surface 34c in the vertical direction.

A power feeder 40 is connected to the cooling table 34. For example, the power feeder 40 is a power feeding rod, and is connected to the lower surface 34d of the cooling table 34. The power feeder 40 is formed of aluminum or an aluminum alloy.

The power feeder 40 is electrically connected to a high-frequency power source 42 and a high-frequency power source 44 provided on the outside of the chamber body 12. The high-frequency power source 42 is a power source which generates first high frequency wave for generating plasma. The frequency of the first high frequency wave is, for example, 40 MHz. The high-frequency power source 44 is a power source which generates second high frequency wave for attraction of ions. The frequency of the second high frequency wave is, for example, 13.56 MHz.

The high-frequency power source 42 is connected to the power feeder 40 via a matcher 46. The matcher 46 includes a matching circuit for matching impedance on a load side of the high-frequency power source 42 to output impedance of the high-frequency power source 42. The high-frequency power source 44 is connected to the power feeder 40 via a matcher 48. The matcher 48 includes a matching circuit for matching impedance on a load side of the high-frequency power source 44 to output impedance of the high-frequency power source 44.

A passage 34f for a refrigerant is formed in the cooling table 34. For example, the passage 34f spirally extends in the cooling table 34. A refrigerant is supplied from a chiller unit TU to the passage 34f. In one embodiment, the refrigerant supplied to the passage 34f is a refrigerant which absorbs heat by vaporization of the refrigerant to perform cooling. The refrigerant may be, for example, a hydro-fluorocarbon-based refrigerant.

The electrostatic chuck 36 is provided above the cooling table 34. Specifically, the electrostatic chuck 36 is provided above the first upper surface 34c of the cooling table 34. The electrostatic chuck 36 includes a base 50 and an attracting portion 52. The base 50 configures a lower electrode and is provided above the cooling table 34. The base 50 has conductivity. For example, the base 50 may be formed of ceramics in which conductivity is applied to aluminum nitride or silicon carbide, or may be formed of metal (for example, titanium).

The base 50 has a substantially disk shape. The base 50 includes a center portion 50a and a peripheral portion 50b. The center portion 50a has a substantially disk shape. The center portion 50a provides a first upper surface 50c of the base 50. The first upper surface 50c is a substantially circular surface.

The peripheral portion 50b is continued to the center portion 50a and extends on the outside of the center portion 50a in the circumferential direction and along the radial direction. In one embodiment, the peripheral portion 50b provides a lower surface 50d of the base 50 along with the center portion 50a. In addition, the peripheral portion 50b provides a second upper surface 50e. The second upper surface 50e is a band-shaped surface and extends on the outside of the first upper surface 50c in the radial direction and along the circumferential direction. In addition, the second upper surface 50e is positioned to be closer to the lower surface 50d than the first upper surface 50c in the vertical direction.

The attracting portion 52 is provided on the base 50. The attracting portion 52 is joined to the base 50 by metal joining using metal which is interposed between the attracting portion 52 and the base 50. The attracting portion 52 has a substantially disk shape and is formed of ceramics. The ceramics configuring the attracting portion 52 may be ceramics having volume resistivity of $1 \times 10^{15}$ Ω·cm or more in a temperature range from a room temperature (for example, 20° C.) to 400° C. For example, as such ceramics, aluminum oxide (alumina) may be used. According to the ceramic attracting portion 52 having the above-described volume resistivity, a sufficient attracting force is exerted even at a high temperature exceeding 200° C.

The electrostatic chuck 36 includes a plurality of regions RN which are coaxial with respect to the axis Z, that is, the center axis of the electrostatic chuck 36. In one embodiment, the electrostatic chuck 36 includes a first region R1, a second region R2, and a third region R3. The first region R1 intersects the axis Z, the third region R3 is a region including the edge of the electrostatic chuck 36, and the second region R2 is positioned between the first region R1 and the third region R3. In an example, the first region R1 is a region having a radius of 120 mm from the center of the electrostatic chuck 36, the second region R2 is a region from a radius of 120 mm to a radius of 135 mm in the electrostatic chuck 36, and the third region R3 is a region from a radius of 135 mm to a radius of 150 mm in the electrostatic chuck 36. It should be noted that the number of the regions of the electrostatic chuck 36 may be an arbitrary number of two or more.

An attracting electrode 54 is built in the attracting portion 52 of the electrostatic chuck 36. The attracting electrode 54 is an electrode film, and a direct-current power source 60 is electrically connected to the attracting electrode 54. When a direct-current voltage is applied from the direct-current power source 60 to the attracting electrode 54, the attracting portion 52 generates an electrostatic force such as a Coulomb force and holds the workpiece W by the electrostatic force.

A plurality of heaters HN are built in the attracting portion 52. The heaters HN are provided in the regions RN of the electrostatic chuck, respectively. In one embodiment, the heaters HN include a first heater 56, a second heater 57, and a third heater 58. The first heater 56 is provided in the first region R1, the second heater 57 is provided in the second region R2, and the third heater 58 is provided in the third region R3.

The heaters HN are connected to a heater power source 62. In one embodiment, a filter 64 is provided between the first heater 56 and the heater power source 62 to prevent high frequency wave from entering the heater power source 62. A filter 65 is provided between the second heater 57 and the heater power source 62 to prevent high frequency wave from entering the heater power source 62. In addition, a filter 66 is provided between the third heater 58 and the heater power source 62 to prevent high frequency wave from entering the heater power source 62.

A plurality of first elastic members EM1 are provided between the base 50 and the cooling table 34. The first elastic members EM1 separate the electrostatic chuck 36 upward from the cooling table 34. Each of the first elastic members EM1 is an O-ring. The first elastic members EM1 have diameters different from each other and are coaxially provided with respect to the axis Z. In addition, the first elastic members EM1 are provided below the boundary of the adjacent regions of the electrostatic chuck 36 and the edge of the electrostatic chuck 36. In one embodiment, the first elastic members EM1 include an elastic member 67, an elastic member 68, and an elastic member 69. The elastic member 67 is provided below the boundary between the first region R1 and the second region R2, the elastic member 68 is provided below the boundary between the second region R2 and the third region R3, and the elastic member 69 is provided below the edge of the electrostatic chuck 36.

The first elastic members EM1 are partially disposed in grooves provided by the first upper surface 34c of the cooling table 34, and are in contact with the first upper surface 34c and the lower surface 50d of the base 50. The first elastic members EM1 define a plurality of heat transfer spaces DSN between the first upper surface 34c of the cooling table 34 and the lower surface 50d of the base 50 along with the cooling table 34 and the base 50. The heat transfer spaces DSN extend below the regions RN of the electrostatic chuck 36, respectively, and are separated from each other. In the embodiment, the heat transfer spaces DSN include a first heat transfer space DS1, a second heat transfer space DS2, and a third heat transfer space DS3. The first heat transfer space DS1 is positioned inside the elastic member 67, the second heat transfer space DS2 is positioned between the elastic member 67 and the elastic member 68, and the third heat transfer space DS3 is positioned between the elastic member 68 and the elastic member 69. As described below, the gas source GS of the heat transfer gas (for example, He gas), the chiller unit TU, and the exhaust device VU are selectively connected to the heat transfer spaces DSN by a piping system PS.

The length of each of the heat transfer spaces DSN in the vertical direction is dependent on a set temperature range of the electrostatic chuck 36 when the processing apparatus 10 is used, and is set to, for example, a length from 0.1 mm to 2.0 mm. As an example, in a case where the set temperature range of the electrostatic chuck 36 is from 80° C. to 250° C., the length of each of the heat transfer spaces DSN in the vertical direction is set to 0.5 mm. In a case where the lower limit value of the set temperature range of the electrostatic chuck 36 is a temperature lower than 80° C., the length of each of the heat transfer spaces DSN in the vertical direction is set to a length which is shorter than 0.5 mm.

In one embodiment, the first elastic members EM1 are configured to have a thermal resistance which is higher than the thermal resistance of each of the heat transfer spaces DSN to which He gas is supplied. The thermal resistance of each of the heat transfer spaces DSN is dependent on thermal conductivity of the heat transfer gas, the length thereof in the vertical direction, and the area thereof. In addition, the thermal resistance of each of the first elastic members EM1 is dependent on the thermal conductivity, the thickness thereof in the vertical direction, and the area thereof. Accordingly, the material, the thickness, and the area of each of the first elastic members EM1 are determined according to the thermal resistance of each of the heat transfer spaces DSN. For the first elastic members EM1, low thermal conductivity and high thermostability are required.

Accordingly, the first elastic members EM1 may be formed of, for example, perfluoroelastomer.

The pedestal 14 further includes a fastening member 70. The fastening member 70 is formed of metal, and is configured to interpose the base 50 and the first elastic members EM1 between the fastening member 70 and the cooling table 34. In order to reduce heat conduction via the fastening member 70 between the base 50 and the cooling table 34, the fastening member 70 is formed of a material having low thermal conductivity, for example, titanium.

In one embodiment, the fastening member 70 includes a cylindrical portion 70a and an annular portion 70b. The cylindrical portion 70a has a substantially cylindrical shape, and provides a first lower surface 70c on the lower end. The first lower surface 70c is a band-shaped surface extending in the circumferential direction.

The annular portion 70b has a substantially annular plate shape, is continued to the inner edge of the upper portion of the cylindrical portion 70a, and extends toward the inside in the radial direction from the cylindrical portion 70a. The annular portion 70b is provides a second lower surface 70d. The second lower surface 70d is a band-shaped surface extending in the circumferential direction.

The fastening member 70 is arranged such that the first lower surface 70c is in contact with the second upper surface 34e of the cooling table 34, and the second lower surface 70d is in contact with the second upper surface 50e of the base 50. In addition, the fastening member 70 is fixed to the peripheral portion 34b of the cooling table 34 by a screw 72. By adjusting screwing of the screw 72 with respect to the fastening member 70, amounts of crushing of the first elastic members EM1 are adjusted. Accordingly, the lengths of the heat transfer spaces DSN in the vertical direction are adjusted.

In one embodiment, a second elastic member 74 is provided between the lower surface of the inner edge portion of the annular portion 70b of the fastening member 70 and the second upper surface 50e of the base 50. The second elastic member 74 is an O ring, and prevents particles (for example, metal powders) generated by friction between the second lower surface 70d of the fastening member 70 and the second upper surface 50e of the base 50 from moving to the attracting portion 52 side.

The second elastic member 74 generates a reaction force which is smaller than a reaction force generated by the first elastic members EM1. In other words, the first elastic members EM1 are configured such that the reaction force generated by the first elastic members EM1 is greater than the reaction force generated by the second elastic member 74. In addition, the second elastic member 74 is formed of a material which has high thermostability and low thermal conductivity, and may be formed of perfluoroelastomer.

A heater 76 is provided on/above the fastening member 70. The heater 76 extends in the circumferential direction and is connected to the heater power source 62 via a filter 78. The filter 78 is provided to prevent high frequency wave from entering the heater power source 62.

The heater 76 is provided between a first film 80 and a second film 82. The first film 80 is provided on the fastening member 70 side with respect to the second film 82. The first film 80 has lower thermal conductivity than the thermal conductivity of the second film 82. For example, the first film 80 may be a thermal sprayed film of zirconia, and the second film 82 may be a thermal sprayed film of yttrium oxide (yttria). In addition, the heater 76 may be a thermal sprayed film of tungsten.

A focus ring 84 is provided on the second film 82. The focus ring 84 is heated by heat from the heater 76. In addition, most heat fluxes from the heater 76 are directed to the second film 82 rather than the first film 80, and are directed toward the focus ring 84 via the second film 82. Accordingly, the focus ring 84 is effectively heated.

In addition, the cooling table 34 of the pedestal 14, the fastening member 70, and the like is covered by one or more insulating members 86 on the outer circumferential side. For example, the one or more insulating members 86 are formed of aluminum oxide or quartz.

In addition, as shown in FIG. 3, a gas line 90 for supplying heat transfer gas (for example, He gas) to a portion between the workpiece W and the attracting portion 52 is provided in the cooling table 34 and the electrostatic chuck 36 of the pedestal 14. The gas line 90 is connected to a supply unit 91 of the heat transfer gas.

As shown in FIG. 3, the gas line 90 includes a gas line 90a, a gas line 90b, and a gas line 90c. The gas line 90a is formed in the attracting portion 52. In addition, the gas line 90c is formed in the cooling table 34. The gas line 90a and the gas line 90c are connected to each other via the gas line 90b. The gas line 90b is provided by a sleeve 92. The sleeve 92 is a substantially tubular member, has insulation properties on at least a surface thereof, and the surface is formed of ceramics. In an example, the sleeve 92 is formed of insulating ceramics. The sleeve 92 is formed of, for example, aluminum oxide (alumina). In another example, the sleeve 92 may be a metal member in which insulating processing is applied to the surface therefore. For example, the sleeve 92 may have an aluminum main body and an alumite film provided on the surface of the main body.

The base 50 and the cooling table 34 provide an accommodation space for accommodating the sleeve 92. An insulating ceramic film 94 is formed on the surface 50f of the base 50 defining the accommodation space. For example, the film 94 may be a thermal sprayed film of aluminum oxide (alumina).

A third elastic member 96 which seals the accommodation space of the sleeve 92 is provided between the film 94 and the cooling table 34. The third elastic member 96 is an O ring and has insulation properties. The third elastic member 96 is formed of, for example, perfluoroelastomer. In addition, a fourth elastic member 98 is provided on the outside of the third elastic member 96. The fourth elastic member 98 is an O ring, is in contact with the first upper surface 34c of the cooling table 34 and the lower surface 50d of the base 50, and seals the heat transfer space (for example, first heat transfer space DS1). The fourth elastic member 98 is formed of, for example, perfluoroelastomer.

As described above, in the pedestal 14, the cooling table 34 and the base 50 are separated from each other by the first elastic members EM1. In addition, in the pedestal 14, an adhesive agent is not used in the joining between the base 50 and the attracting portion 52. Accordingly, it is possible to set the temperature of the electrostatic chuck 36 to a high temperature exceeding 200° C. such as 250° C. In addition, since heat exchange is performed between the electrostatic chuck 36 and the cooling table 34 via the heat transfer gas supplied to the heat transfer spaces DSN, it is also possible to set the temperature of the electrostatic chuck 36 to a low temperature. In addition, in the pedestal 14, a supply route of a high frequency wave to the base 50 of the electrostatic chuck 36 is secured by the power feeder 40, the cooling table 34, and the fastening member 70. In addition, since the power feeder 40 is not directly connected to the base 50 of the electrostatic chuck 36 and is connected to the cooling table 34, aluminum or aluminum alloy can be used as constituent material of the power feeder 40. Accordingly, even in a case where a high frequency wave having a frequency such as 13.56 MHz or more is used, loss of the high frequency wave in the power feeder 40 is suppressed.

In addition, as described above, in one embodiment, the second elastic member 74 is provided between the inner edge portion of the lower surface of the annular portion 70b of the fastening member 70 and the second upper surface 50e of the base 50. Since the second upper surface 50e of the peripheral portion 50b of the base 50 and the second lower surface 70d of the fastening member 70 are in contact with each other, friction may occur at the contact location, particles (for example, metal powders) may be generated. Even when the particles are generated, the second elastic member 74 can prevent the particles from being attached on the attracting portion 52 and the workpiece W placed on the attracting portion 52.

In addition, the first elastic members EM1 are configured such that the reaction forces generated by the first elastic members EM1 are greater than the reaction force generated by the second elastic member 74. Accordingly, it is possible to reliably separate the electrostatic chuck 36 from the cooling table 34.

In addition, in one embodiment, the first elastic members EM1 are configured to have the thermal resistances which are greater than the thermal resistances of the heat transfer spaces DSN when He gas is supplied to the heat transfer spaces DSN. In addition, the first elastic members EM1 are formed of, for example, perfluoroelastomer. According to the first elastic members EM1, the heat conduction via the heat transfer spaces DSN is superior to the heat conduction via the first elastic members EM1 between the electrostatic chuck 36 and the cooling table 34. Accordingly, the temperature distribution of the electrostatic chuck 36 can be uniformized.

In addition, in one embodiment, the gas line 90 for the heat transfer gas which is supplied to the portion between the workpiece W and the attracting portion 52 is formed without using an adhesive agent. In addition, the surface 50f of the base 50 defining the accommodation space in which the sleeve 92 partially configuring the gas line 90 is disposed is covered with the film 94, and the insulating third elastic member 96 is provided between the film 94 and the cooling table 34 to seal the accommodation space. Accordingly, it is possible to prevent plasma from entering the portion between the base 50 and the cooling table 34, and it is possible to suppress insulation damage of the base 50 due to the entering of the plasma.

In addition, according to the processing apparatus 10 having the above-described pedestal 14, it is possible to perform plasma processing on the workpiece W in a temperature zone from a low temperature such as 80° C. or less to a high temperature exceeding 200° C. such as 250° C.

Figure 4:
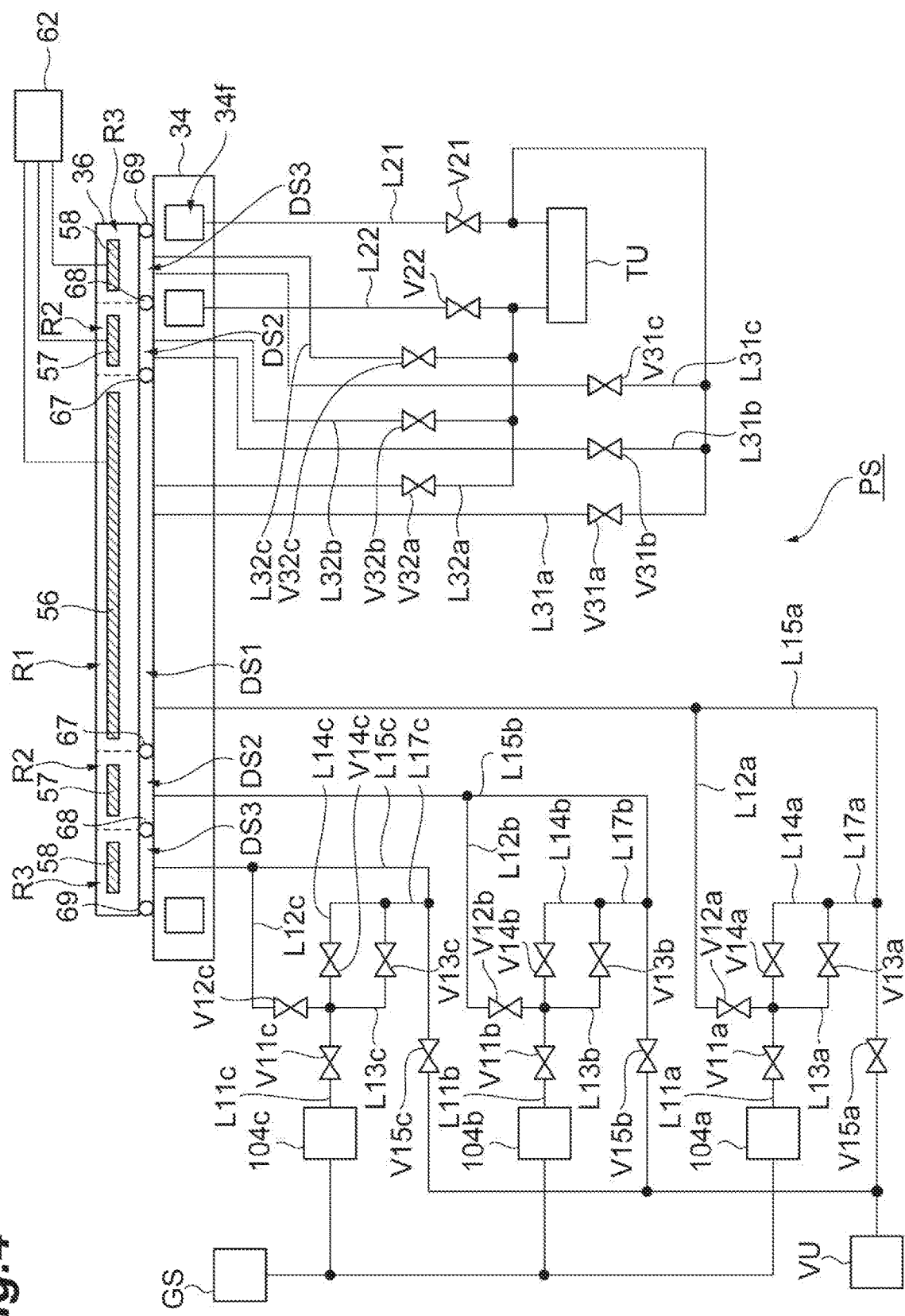
FIG. 4 is a view illustrating a configuration of a piping system according to an exemplary embodiment.

Hereinafter, the piping system PS which may be used in the processing apparatus 10 will be described. FIG. 4 is a view illustrating the configuration of the piping system according to an exemplary embodiment. The piping system PS shown in FIG. 4 includes a plurality of valves. The piping system PS is configured to selectively connect the gas source GS, the chiller unit TU, and the exhaust device VU to each of the heat transfer spaces DSN and to switch connection and disconnection between the chiller unit TU and the passage 34f. Hereinafter, an embodiment will be described in which the heat transfer spaces DSN are configured of three heat transfer spaces (first heat transfer space DS1, second heat transfer space DS2, and third heat transfer space DS3). However, the number of the heat transfer spaces DSN may be an arbitrary number as long as it is the number corresponding to the number of the regions RN of the electrostatic chuck 36.

The piping system PS includes a pipe L21, a pipe L22, a valve V21, and a valve V22. One end of the pipe L21 is connected to the chiller unit TU and the other end of the pipe L21 is connected to the passage 34f. The valve V21 is provided midway in the pipe L21. One end of the pipe L22 is connected to the chiller unit TU and the other end of the pipe L22 is connected to the passage 34f. The valve V22 is provided midway in the pipe L22. When the valve V21 and the valve V22 are open, a refrigerant is supplied from the chiller unit TU to the passage 34f via the pipe L21. The refrigerant supplied to the passage 34f is returned to the chiller unit TU via the pipe L22.

In addition, the piping system PS further includes a pressure regulator 104a, a pipe L11a, a pipe L12a, a pipe L13a, a pipe L14a, a pipe L15a, a pipe L17a, a pipe L31a, a pipe L32a, a valve V11a, a valve V12a, a valve V13a, a valve V14a, a valve V15a, a valve V31a, and a valve 32a.

The pressure regulator 104a is connected to the gas source GS. One end of the pipe L11a is connected to the pressure regulator 104a. The valve V11a is provided midway in the pipe L11a. One end of the pipe L15a is connected to the first heat transfer space DS1. The other end of the pipe L15a is connected to the exhaust device VU. In addition, the valve V15a is provided midway in the pipe L15a.

The other end of the pipe L11a is connected to one end of the pipe L12a. The other end of the pipe L12a is connected to the pipe L15a on the first heat transfer space DS1 side with respect to the valve V15a. The valve V12a is provided midway in the pipe L12a. One end of the pipe L13a and one end of the pipe L14a are connected to the other end of the pipe L11a. The valve V13a is provided midway in the pipe L13a, and the valve V14a is provided midway in the pipe L14a. The other end of the pipe L13a and the other end of the pipe L14a are connected to each other. One end of the pipe L17a is connected to the connection point between the other end of the pipe L13a and the other end of the pipe L14a. The other end of the pipe L17a is connected to the pipe L15a to be closer to the valve V15a than the other end of the pipe L12a.

One end of the pipe L31a is connected to the pipe L21 on the chiller unit TU side with respect to the valve V21. The other end of the pipe L31a is connected to the first heat transfer space DS1. The valve V31a is provided midway in the pipe L31a. One end of the pipe L32a is connected to the pipe L22 on the chiller unit TU side with respect to the valve V22. The other end of the pipe L32a is connected to the first heat transfer space DS1. The valve V32a is provided midway in the pipe L32a.

The piping system PS further includes a pressure regulator 104b, a pipe L11b, a pipe L12b, a pipe L13b, a pipe L14b, a pipe L15b, a pipe L17b, a pipe L31b, a pipe L32b, a valve V11b, a valve V12b, a valve V13b, a valve V14b, a valve V15b, a valve V31b, and a valve V32b.

The pressure regulator 104b is connected to the gas source GS. One end of the pipe L11b is connected to the pressure regulator 104b. The valve V11b is provided midway in the pipe L11b. One end of the pipe L15b is connected to the second heat transfer space DS2. The other end of the pipe L15b is connected to the exhaust device VU. In addition, the valve V15b is provided midway in the pipe L15b.

The other end of the pipe L11b is connected to one end of the pipe L12b. The other end of the pipe L12b is connected to the pipe L15b on the second heat transfer space DS2 side with respect to the valve V15b. The valve V12b is provided midway in the pipe L12b. One end of the pipe L13b and one end of the pipe L14b are connected to the other end of the pipe L11b. The valve V13b is provided midway in the pipe L13b, and the valve V14b is provided midway in the pipe L14b. The other end of the pipe L13b and the other end of the pipe L14b are connected to each other. One end of the pipe L17b is connected to the connection point between the other end of the pipe L13b and the other end of the pipe L14b. The other end of the pipe L17b is connected to the pipe L15b to be closer to the valve V15b than the other end of the pipe L12b.

One end of the pipe L31b is connected to the pipe L21 on the chiller unit TU side with respect to the valve V21. The other end of the pipe L31b is connected to the second heat transfer space DS2. The valve V31b is provided midway in the pipe L31b. One end of the pipe L32b is connected to the pipe L22 on the chiller unit TU side with respect to the valve V22. The other end of the pipe L32b is connected to the second heat transfer space DS2. The valve V32b is provided midway in the pipe L32b.

The piping system PS further includes a pressure regulator 104c, a pipe L11c, a pipe L12c, a pipe L13c, a pipe L14c, a pipe L15c, a pipe L17c, a pipe L31c, a pipe L32c, a valve V11c, a valve V12c, a valve V13c, a valve V14c, a valve V15c, a valve V31c, and a valve V32c.

The pressure regulator 104c is connected to the gas source GS. One end of the pipe L11c is connected to the pressure regulator 104c. The valve V11c is provided midway in the pipe L11c. One end of the pipe L15c is connected to the third heat transfer space DS3. The other end of the pipe L15c is connected to the exhaust device VU. In addition, the valve V15c is provided midway in the pipe L15c.

The other end of the pipe L11c is connected to one end of the pipe L12c. The other end of the pipe L12c is connected to the pipe L15c on the third heat transfer space DS3 side with respect to the valve V15c. The valve V12c is provided midway in the pipe L12c. One end of the pipe L13c and one end of the pipe L14c are connected to the other end of the pipe L11c. The valve V13c is provided midway in the pipe L13c, and the valve V14c is provided midway in the pipe L14c. The other end of the pipe L13c and the other end of the pipe L14c are connected to each other. One end of the pipe L17c is connected to the connection point between the other end of the pipe L13c and the other end of the pipe L14c. The other end of the pipe L17c is connected to the pipe L15c to be closer to the valve V15c than the other end of the pipe L12c.

One end of the pipe L31c is connected to the pipe L21 on the chiller unit TU side with respect to the valve V21. The other end of the pipe L31c is connected to the third heat transfer space DS3. The valve V31c is provided midway in the pipe L31c. One end of the pipe L32c is connected to the pipe L22 on the chiller unit TU side with respect to the valve V22. The other end of the pipe L32c is connected to the third heat transfer space DS3. The valve V32c is provided midway in the pipe L32c.

Figure 17:
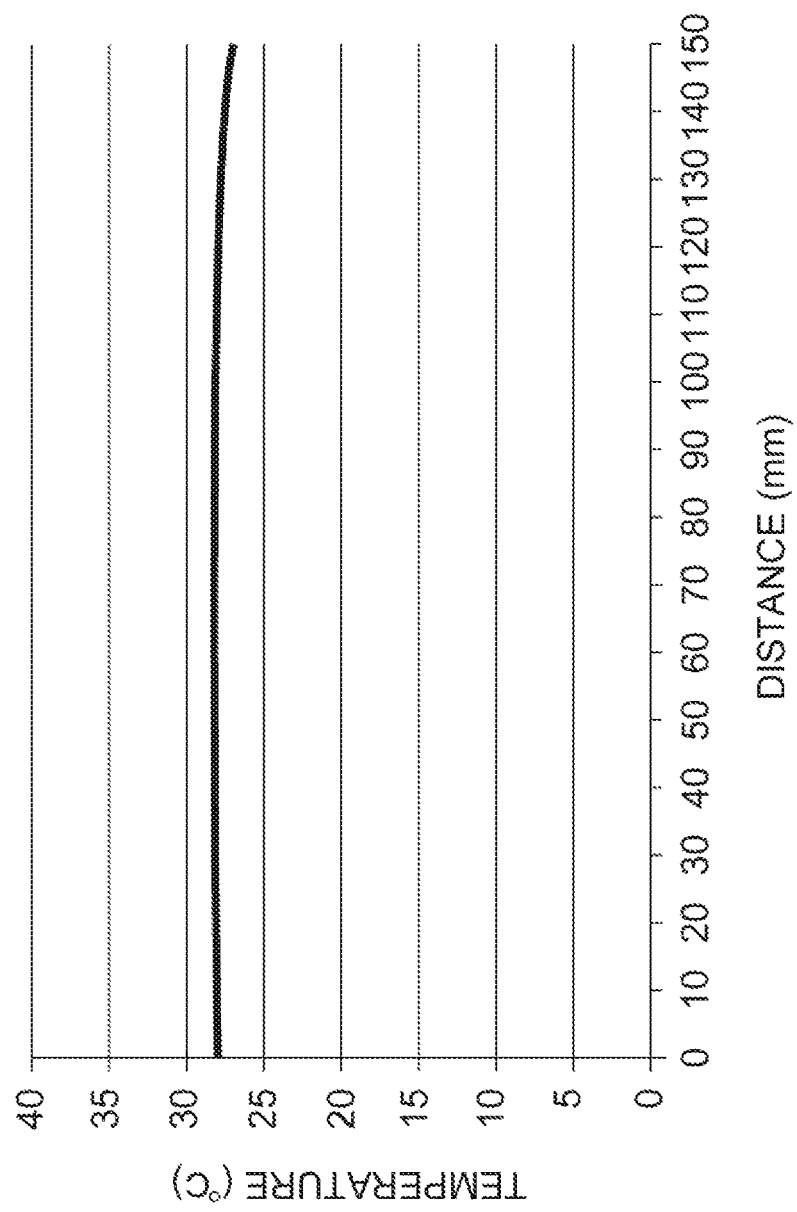
FIG. 17 is a view illustrating a temperature distribution of the electrostatic chuck.
Figure 18:
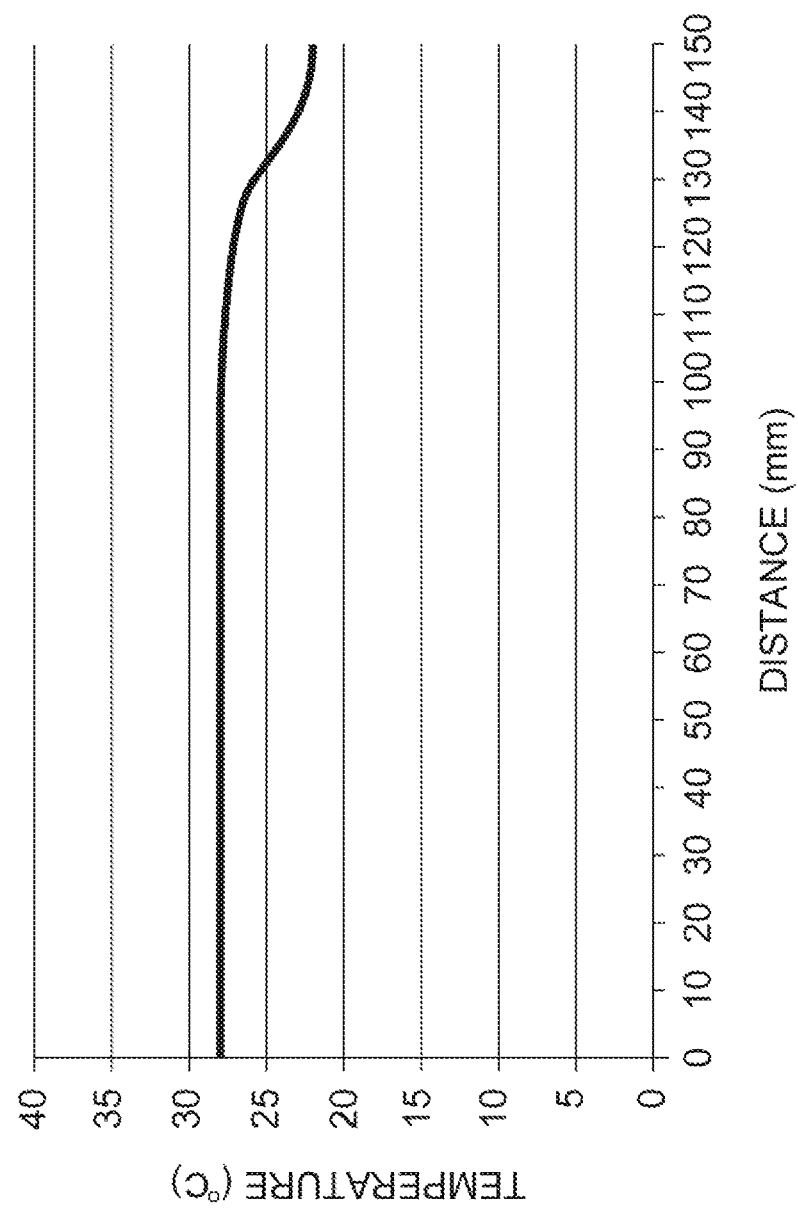
FIG. 18 is a view illustrating a temperature distribution of the electrostatic chuck.
Figure 19:
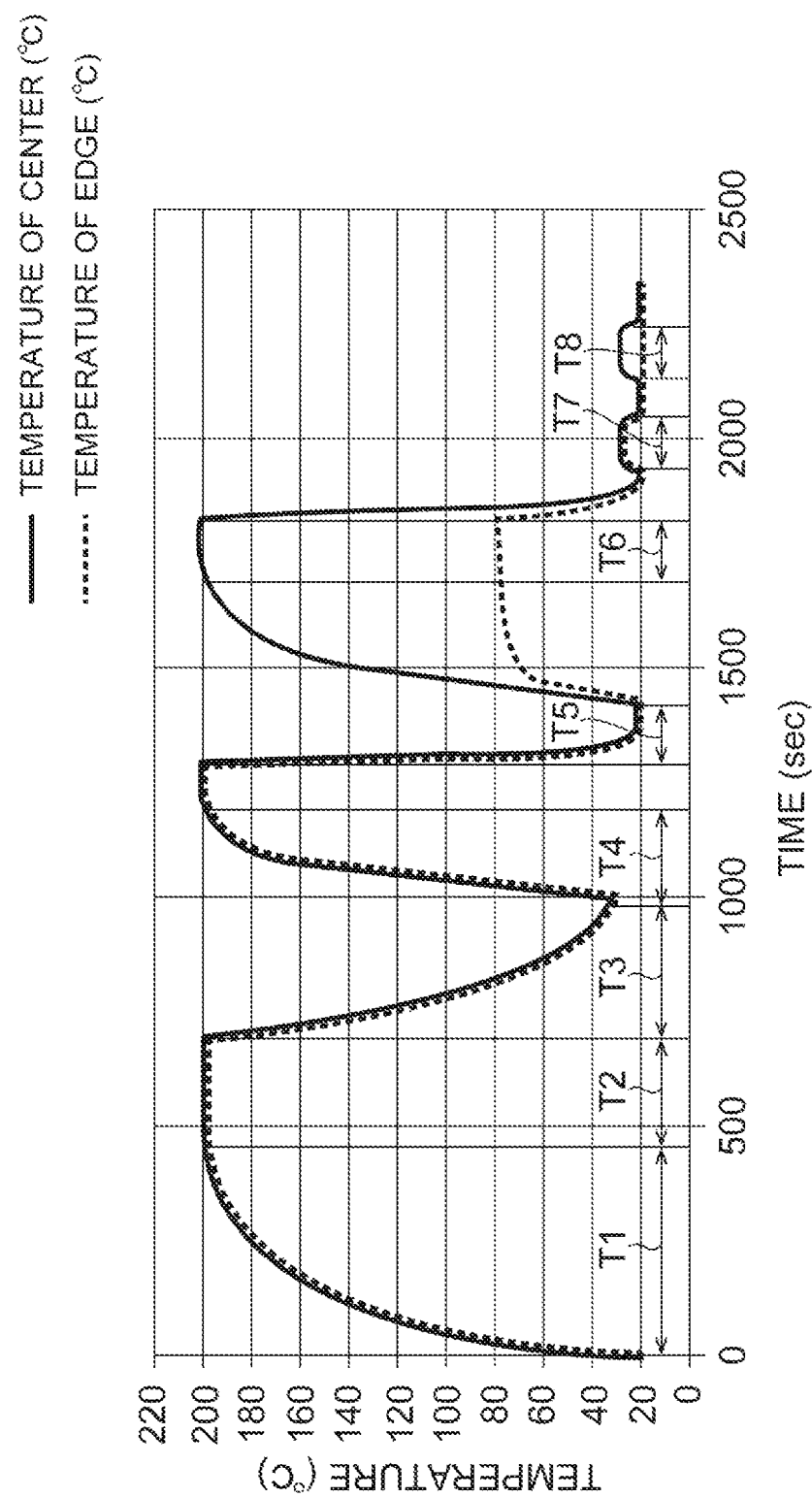
FIG. 19 is a view illustrating a temporal change of the temperature of the electrostatic chuck.

Opening and closing of each of the plurality of valves in the piping system PS are controlled by the controller MCU. In addition, as described above, the heater power source 62 is also controlled by the controller MCU. In the controls of the valves of the piping system PS and the heater power source 62 performed by the controller MCU, there are a plurality of modes. Hereinafter, the controls of the valves of the piping system PS and the control of the heater power source 62 in each of the modes will be described with reference to FIGS. 5 to 13. FIGS. 5 to 13 are views illustrating the state of the piping system in each of the modes. In FIGS. 5 to 13, filled symbols indicating the valves shows that the valves are closed, and open symbols indicating the valves shows that the valves are opened. In addition, in the descriptions below, FIGS. 14 to 19 are also referred. FIGS. 14 to 18 are views illustrating temperature distributions of the electrostatic chuck. FIG. 19 is a view illustrating a temporal change of the temperature of the electrostatic chuck. In FIGS. 14 to 18, a horizontal axis indicates a distance between each position on the radius of the attracting portion 52 of the electrostatic chuck 36 and the center of the attracting portion 52, and a vertical axis indicates the temperature of each position of the attracting portion 52. It should be noted that FIGS. 14 to 18 show the temperature of each position to 150 mm on the radius based on the center of the attracting portion 52 on the assumption that the diameter of the workpiece W is 300 mm. In addition, in FIG. 19, a horizontal axis indicates a time, and a vertical axis indicates the temperature of the attracting portion 52. In FIG. 19, the temporal change of the temperature at the center of the attracting portion 52 of the electrostatic chuck 36 and the temporal change of the temperature of the edge thereof are shown.

Figure 5:
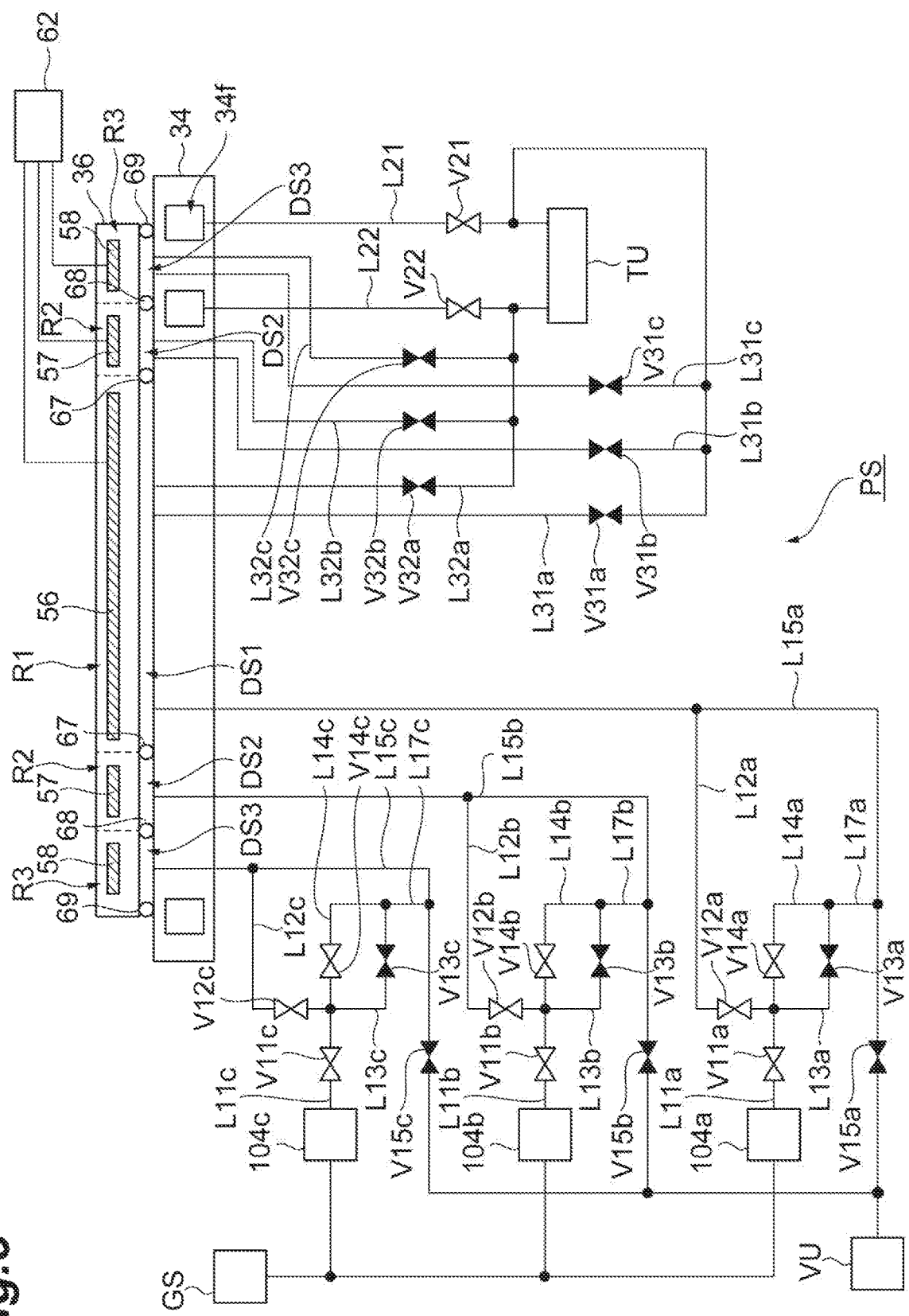
FIG. 5 is a view illustrating a state of the piping system.
Figure 14:
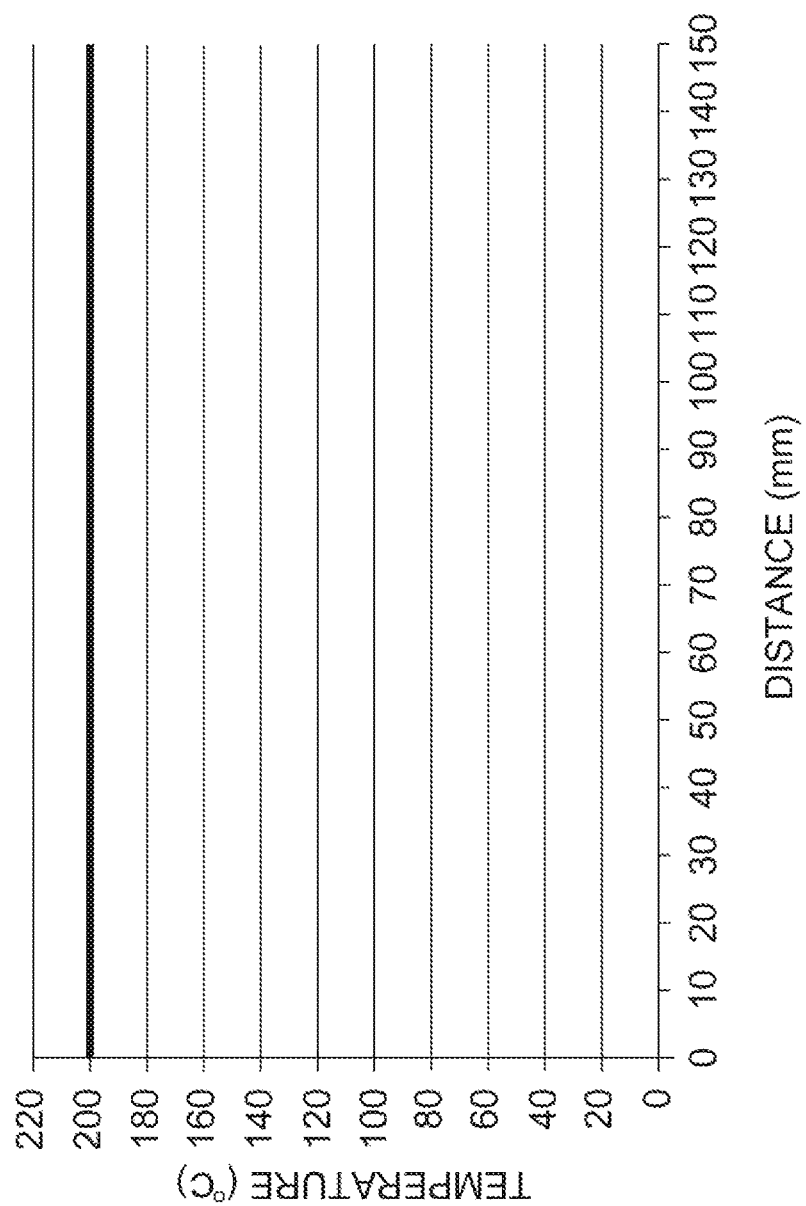
FIG. 14 is a view illustrating a temperature distribution of an electrostatic chuck.

As shown in FIG. 5, in a first mode, the heater power source 62 is controlled o supply power to the heaters HN. In addition, in the first mode, power may be supplied to the heaters HN such that the heaters HN generate heat at substantially the same heating value as each other. In addition, in the first mode, the valves of the piping system PS are controlled to circulate the refrigerant between the passage 34f and the chiller unit TU and to connect the heat transfer spaces DSN to the gas source GS. In the example of the piping system PS shown in FIG. 5, in the first mode, the valve V11a, the valve V12a, the valve V14a, the valve V11b, the valve V12b, the valve V14b, the valve V11c, the valve V12c, the valve V14c, the valve V21, and the valve V22 are opened, and other valves of the plurality of valves of the piping system PS are closed. According to the control of the first mode, the heaters HN generate heat, the heat transfer gas is supplied to the heat transfer spaces DSN, and the refrigerant is supplied to the passage 34f. Accordingly, as shown in FIG. 14, the temperature of the attracting portion 52 of the electrostatic chuck 36 is a relatively high temperature, and the temperature distribution of the electrostatic chuck 36 in the radial direction is substantially constant.

Figure 6:
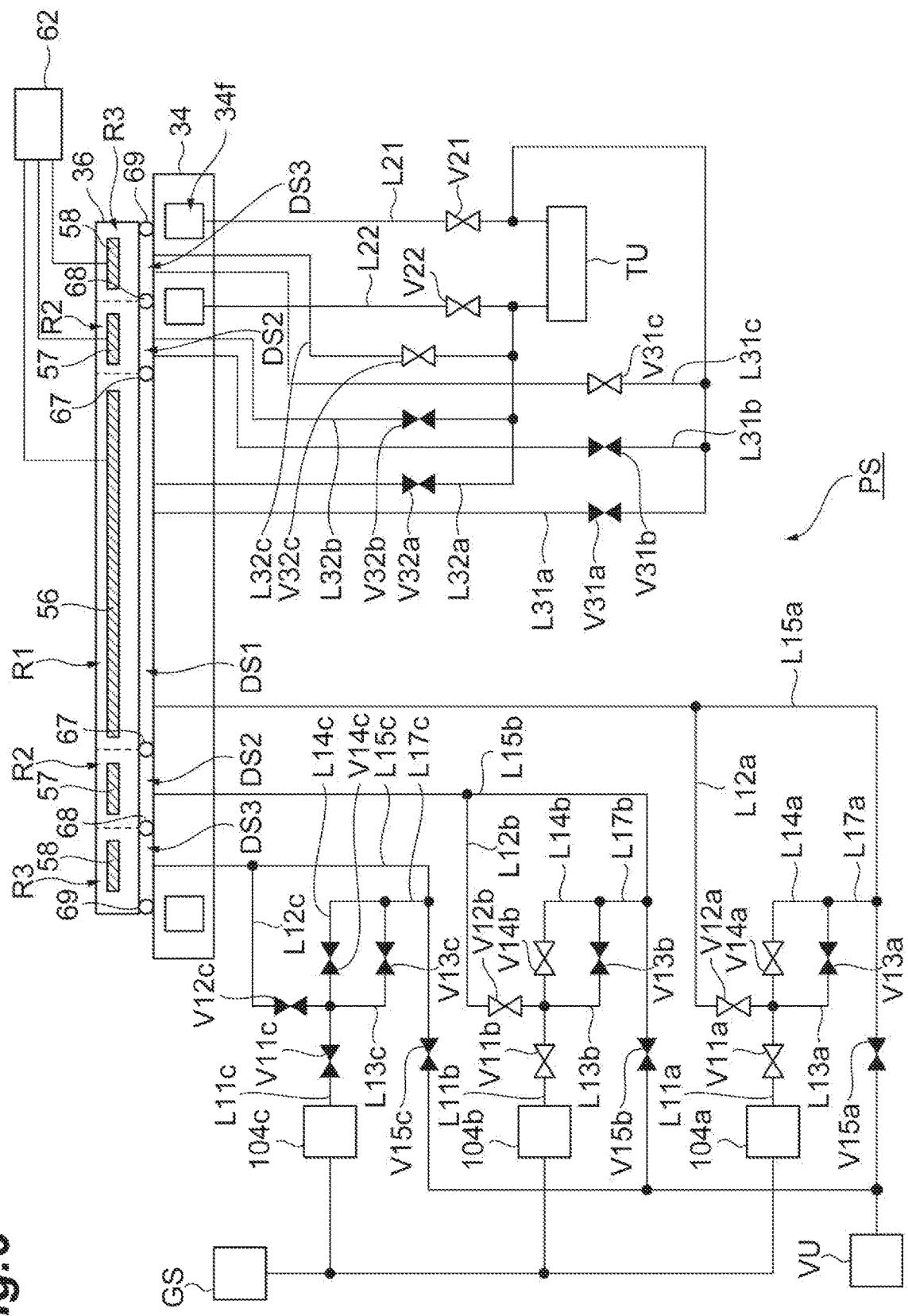
FIG. 6 is a view illustrating a state of the piping system.
Figure 15:
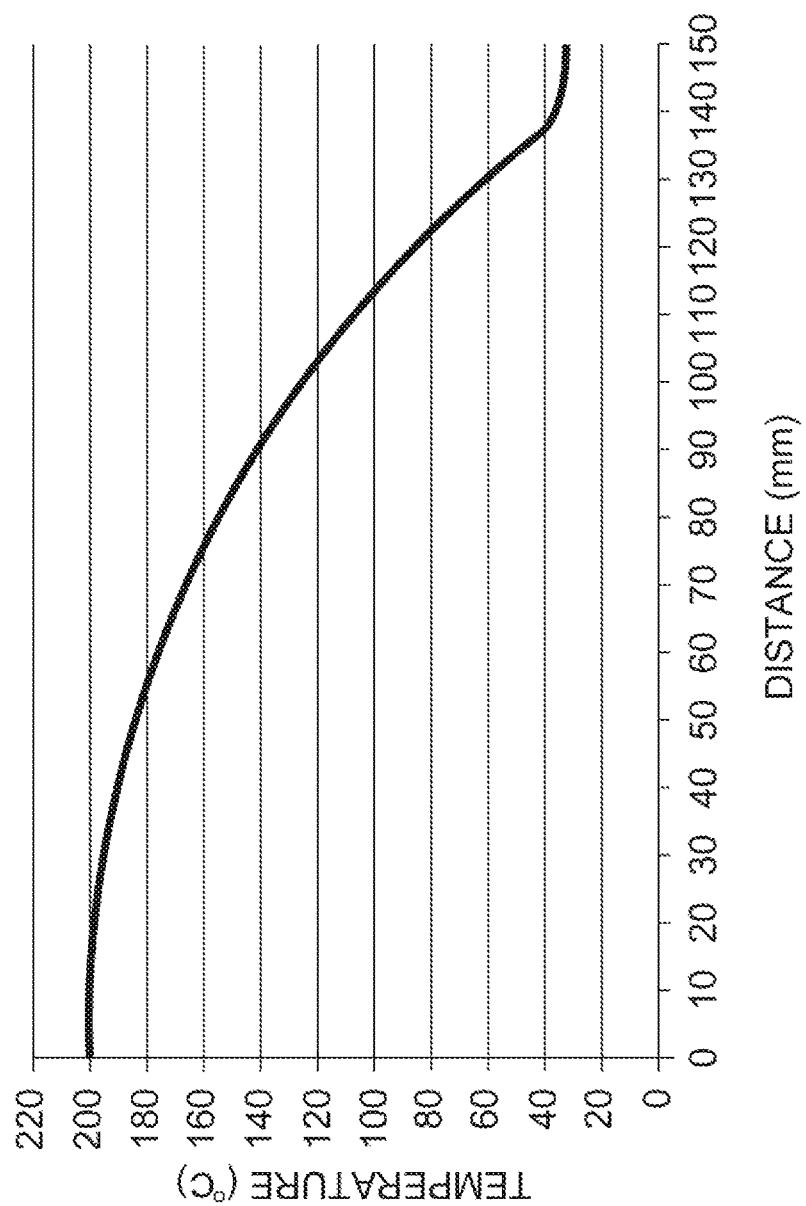
FIG. 15 is a view illustrating a temperature distribution of the electrostatic chuck.

As shown in FIG. 6, in a second mode, the heater power source 62 is controlled such that the heating value of the first heater 56 and the heating value of the second heater 57 are greater than the heating value of the third heater 58. In addition, in the second mode, the same power as the power supplied to the first heater 56 in the first mode may be supplied to the first heater 56, and the same power as the power supplied to the second heater 57 in the first mode may be supplied to the second heater 57. In the second mode, the power may not be supplied to the third heater 58. Moreover, in the second mode, the valves are controlled to circulate the refrigerant between the passage 34f and the chiller unit TU, to connect the first heat transfer space DS1 and the second heat transfer space DS2 to the gas source GS, and to connect the third heat transfer space to the chiller unit. In the example of the piping system PS shown in FIG. 6, in the second mode, the valve V11a, the valve V12a, the valve V14a, the valve V11b, the valve V12b, the valve V14b, the valve V21, the valve V22, the valve V31c, and the valve V32c are opened, and other valves of the plurality of valves of the piping system PS are closed. According to the control of the second mode, the heating value of the first heater 56 and the heating value of the second heater 57 are greater than the heating value of the third heater 58, the heat transfer gas is supplied to the first heat transfer space DS1 and the second heat transfer space DS2, and the refrigerant is supplied to the third heat transfer space DS3 and the passage 34f. Accordingly, as shown in FIG. 15, the temperature of the attracting portion 52 of the electrostatic chuck 36 is a relatively high temperature, and the temperature distribution of the electrostatic chuck 36 in the radial direction becomes a temperature distribution in which the temperature is gently decreased from the center toward the edge.

Figure 7:
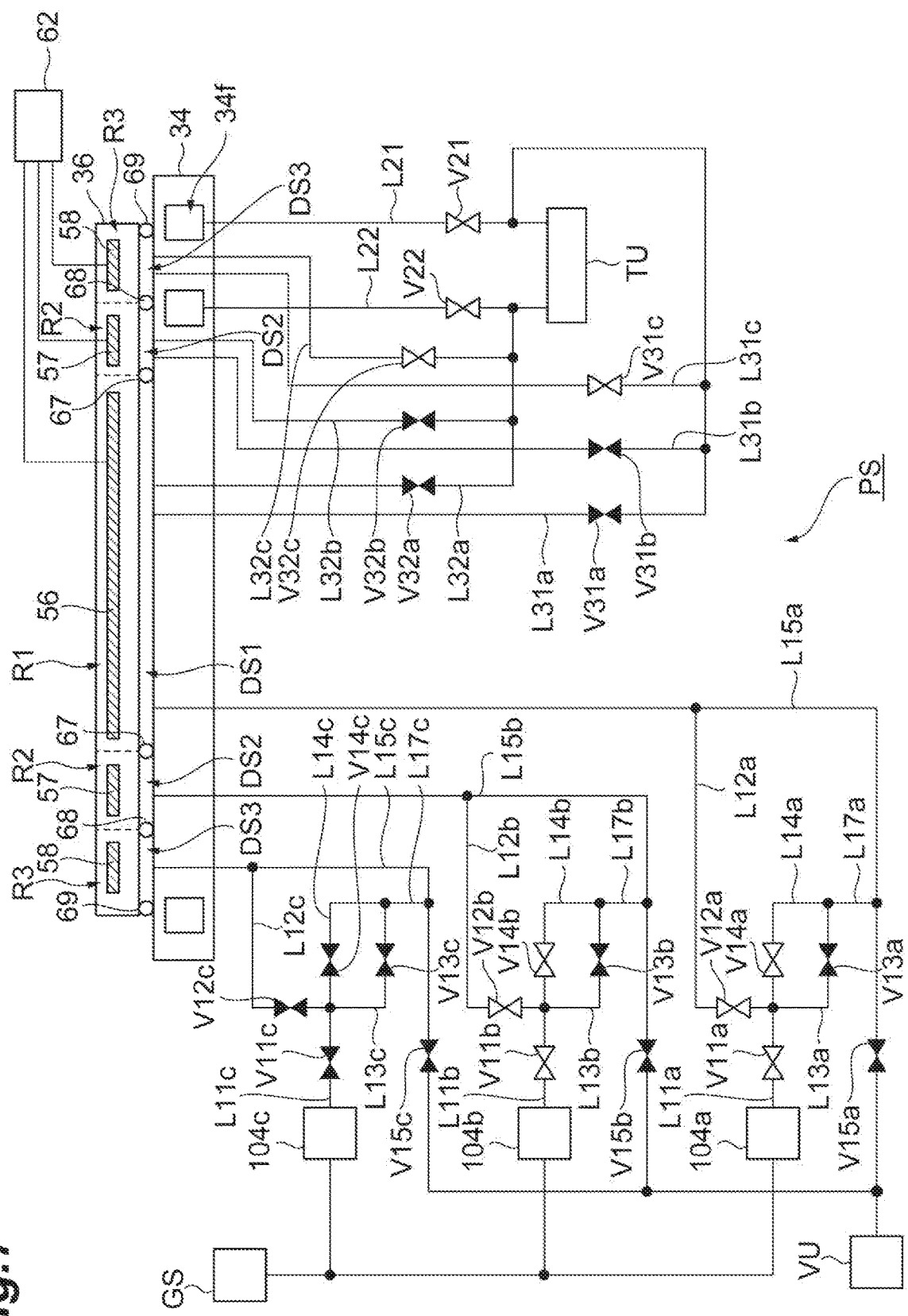
FIG. 7 is a view illustrating a state of the piping system.
Figure 16:
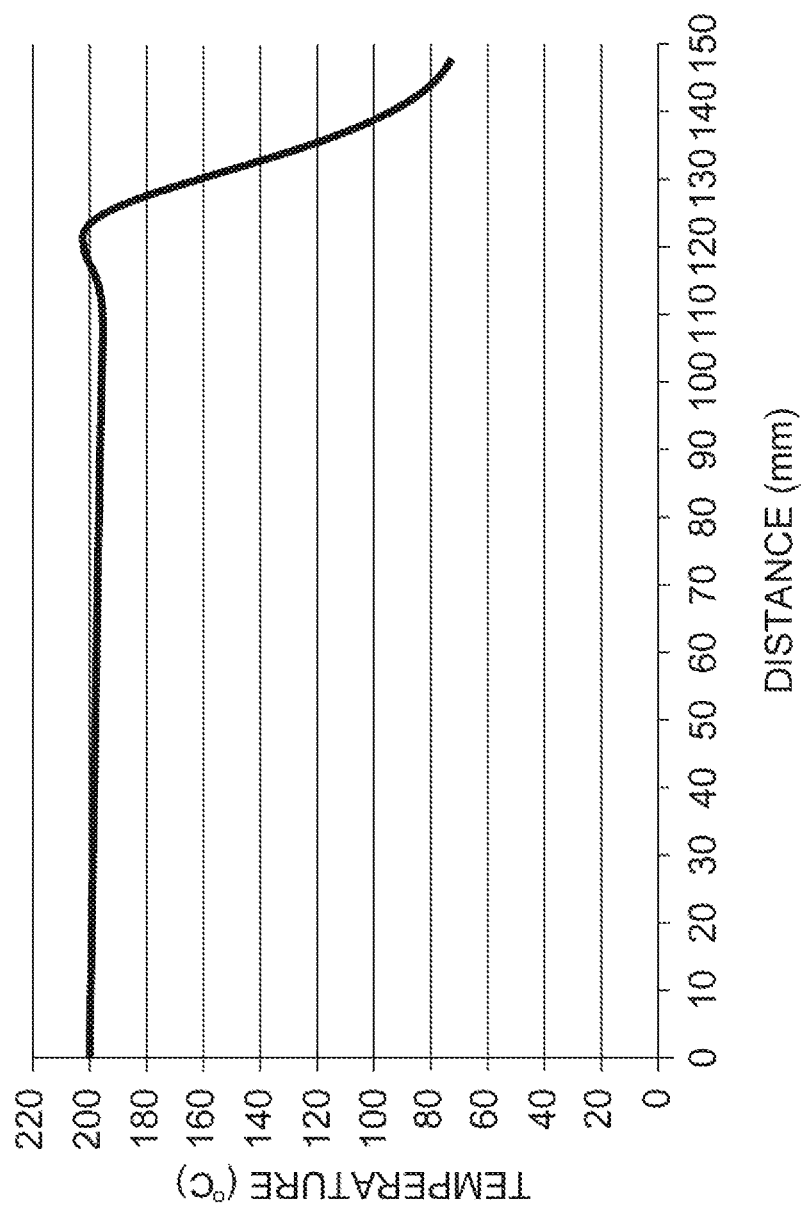
FIG. 16 is a view illustrating a temperature distribution of the electrostatic chuck.

As shown in FIG. 7, in a third mode, the heater power source 62 is controlled such that the heating value of the second heater 57 is greater than the heating value of the first heater 56 and the heating value of the first heater 56 is greater than the heating value of the third heater 58. In addition, in the third mode, the same power as the power supplied to the first heater 56 in the first mode may be supplied to the first heater 56. In the third mode, the power may not be supplied to the third heater 58. Moreover, in the third mode, the valves of the piping system PS are controlled to circulate the refrigerant between the passage 34f and the chiller unit TU, to connect the first heat transfer space DS1 and the second heat transfer space DS2 to the gas source GS, and to connect the third heat transfer space DS3 to the chiller unit TU. In the example of the piping system PS shown in FIG. 7, in the third mode, the valve V11a, the valve V12a, the valve V14a, the valve V11b, the valve V12b, the valve V14b, the valve V21, the valve V22, the valve V31c, and the valve V32c are opened, and other valves of the plurality of valves of the piping system PS are closed. According to the control of the third mode, the heating value of the second heater 57 is greater than the heating value of the first heater 56, the heating value of the first heater 56 is greater than the heating value of the third heater 58, the heat transfer gas is supplied to the first heat transfer space DS1 and the second heat transfer space DS2, and the refrigerant is supplied to the third heat transfer space DS3 and the passage 34f. Accordingly, as shown in FIG. 16, the temperature of the attracting portion 52 of the electrostatic chuck 36 is a relatively high temperature, and the temperature distribution of the electrostatic chuck 36 in the radial direction becomes a temperature distribution in which the temperature is steeply decreased in the region including the edge.

Figure 8:
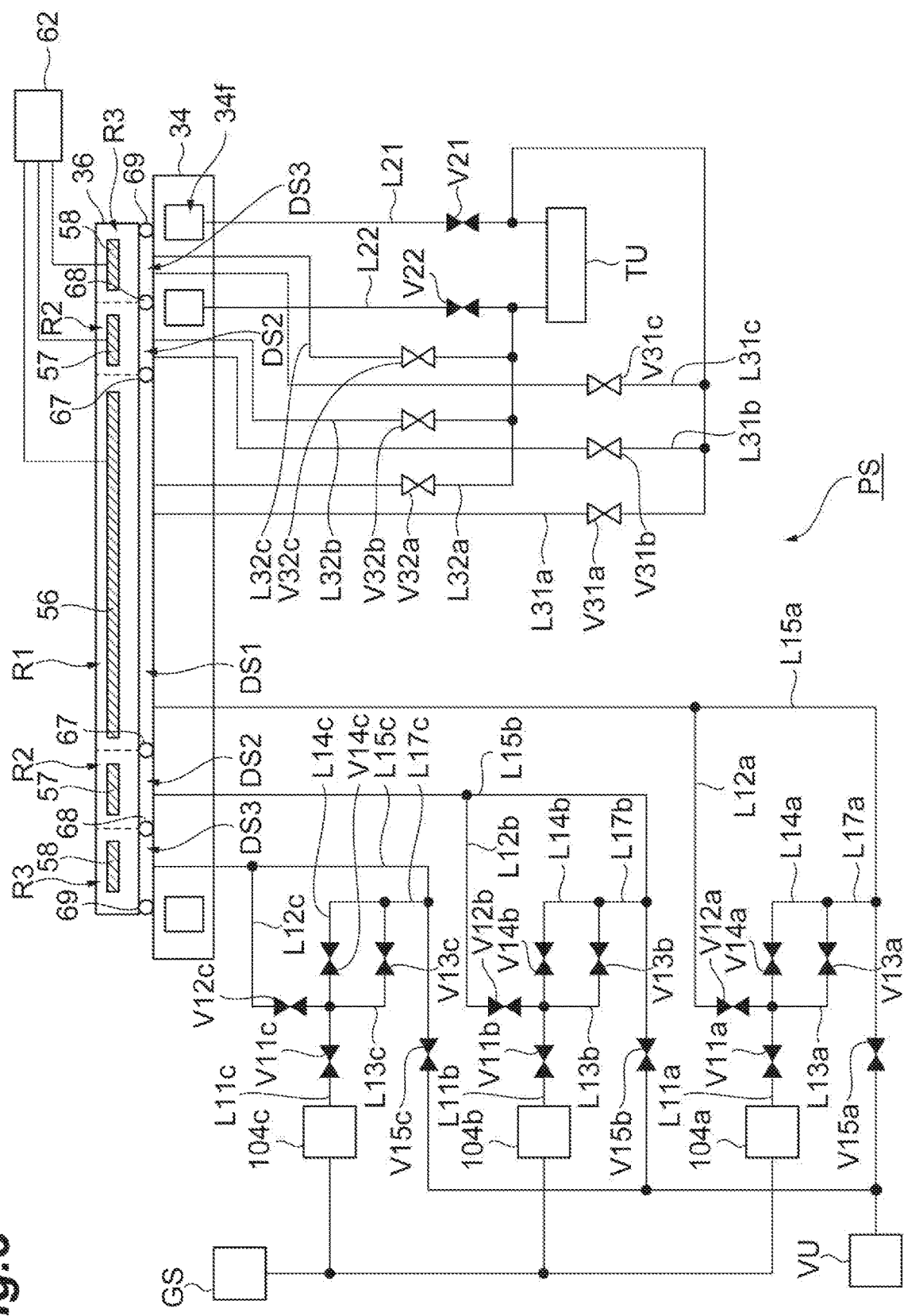
FIG. 8 is a view illustrating a state of the piping system.

As shown in FIG. 8, in a fourth mode, the heater power source 62 is controlled to supply power to the heaters HN. In addition, in the fourth mode, the same power as the power supplied to the first heater 56 in the first mode may be supplied to the first heater 56, the same power as the power supplied to the second heater 57 in the first mode may be supplied to the second heater 57, and the same power as the power supplied to the third heater 58 in the first mode may be supplied to the third heater 58. Moreover, in the fourth mode, the valves of the piping system PS are controlled to connect the heat transfer spaces DSN to the chiller unit TU. In the fourth mode, the refrigerant may not be supplied to the passage 34f or may be supplied to the passage 34f. In the example of the piping system PS shown in FIG. 8, in the fourth mode, the valve V31a, the valve V32a, the valve V31b, the valve V32b, the valve V31c, and the valve V32c are opened, and other valves of the plurality of valves of the piping system PS are closed. According to the control of the fourth mode, the heaters HN generate heat, and the refrigerant is supplied to the heat transfer spaces DSN. Accordingly, as shown in FIG. 17, the temperature of the attracting portion 52 of the electrostatic chuck 36 is a relatively low temperature, and the temperature distribution of the electrostatic chuck 36 in the radial direction is substantially constant.

Figure 9:
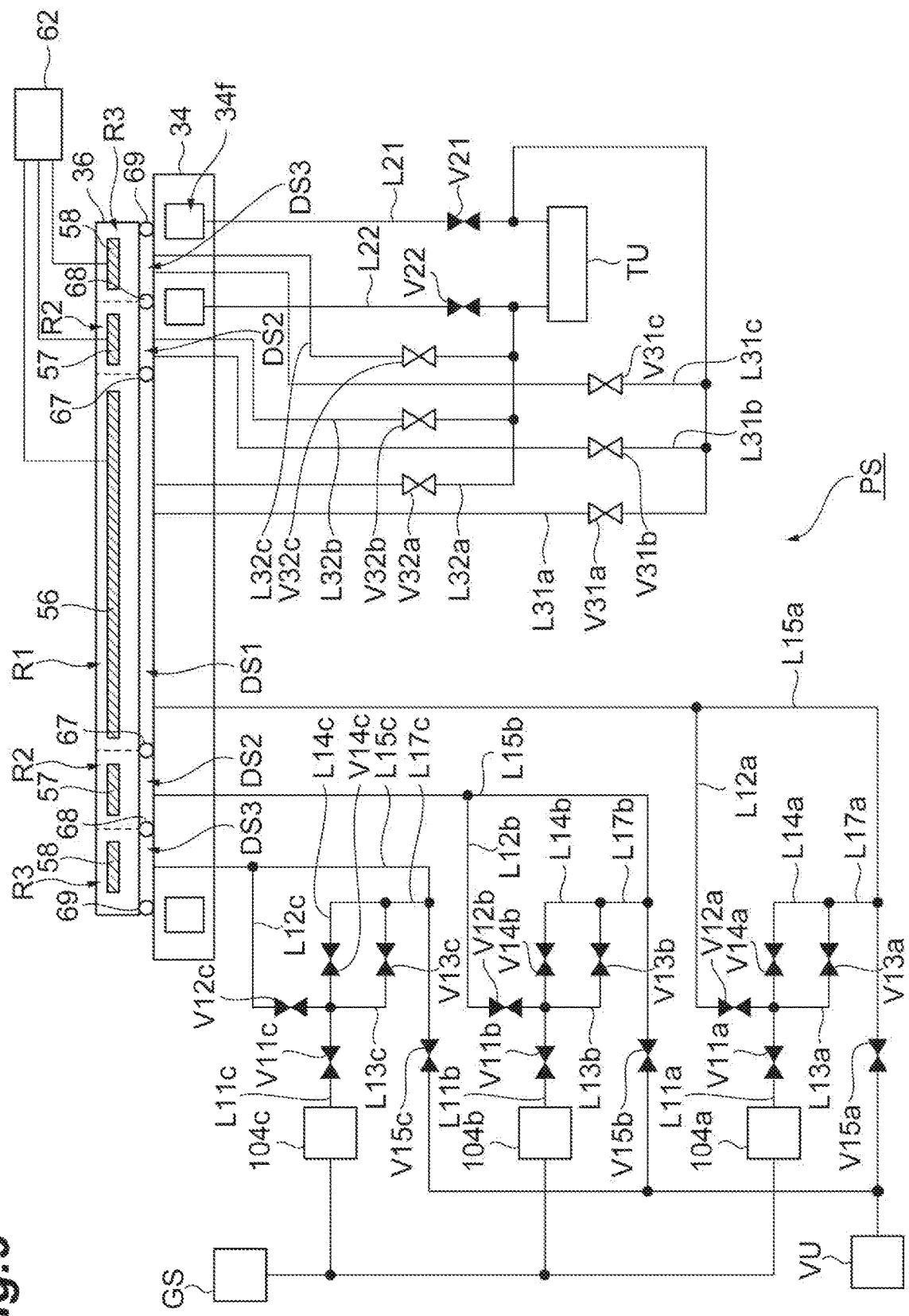
FIG. 9 is a view illustrating a state of the piping system.

As shown in FIG. 9, in a fifth mode, the heater power source 62 is controlled such that the heating value of the first heater 56 and the heating value of the second heater 57 are greater than the heating value of the third heater 58. In addition, in the fifth mode, the same power as the power supplied to the first heater 56 in the first mode may be supplied to the first heater 56, and the same power as the power supplied to the second heater 57 in the first mode may be supplied to the second heater 57. In the fifth mode, power may not be provided to the third heater 58. Moreover, in the fifth mode, the valves of the piping system PS are controlled to connect the heat transfer spaces DSN to the chiller unit TU. In the fifth mode, the refrigerant may not be supplied to the passage 34f or may be supplied to the passage 34f. In the example of the piping system PS shown in FIG. 9, in the fifth mode, the valve V31a, the valve V32a, the valve V31b, the valve V32b, the valve V31c, and the valve V32c are opened, and other valves of the plurality of valves of the piping system PS are closed. According to the control of the fifth mode, the heating value of the first heater 56 and the heating value of the second heater 57 are greater than the heating value of the third heater 58, and the refrigerant is supplied to the heat transfer spaces DSN. Accordingly, as shown in FIG. 18, the temperature of the attracting portion 52 of the electrostatic chuck 36 is a relatively low temperature, and the temperature distribution of the electrostatic chuck 36 in the radial direction becomes a temperature distribution in which the temperature is gently decreased from the center toward the edge.

Figure 10:
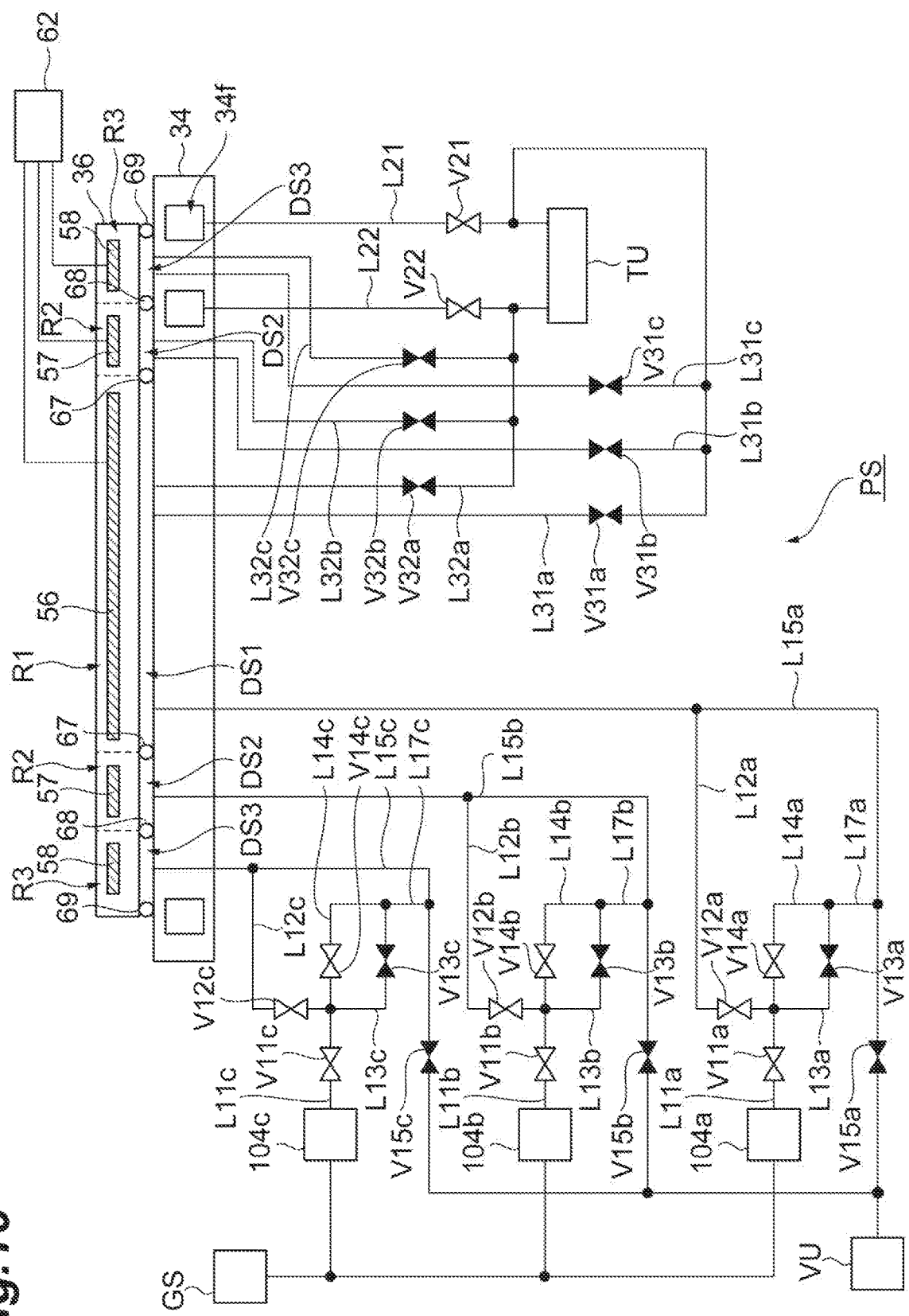
FIG. 10 is a view illustrating a state of the piping system.

As shown in FIG. 10, in a sixth mode, the heater power source 62 is controlled to supply power to the heaters HN. In addition, in the sixth mode, the heater power source 62 is controlled such that the heating values of the heater HN have a higher heating value than the heating values of the heaters HN in the first mode. Moreover, in the sixth mode, power may be supplied to the heaters HN such that the heaters HN generate heat at substantially the same heating value as each other. In addition, in the sixth mode, the valves of the piping system PS are controlled to circulate the refrigerant between the passage 34f and the chiller unit TU, and to connect the heat transfer spaces DSN to the gas source GS. In the example of the piping system PS shown in FIG. 10, in the sixth mode, the valve V11a, the valve V12a, the valve V14a, the valve V11b, the valve V12b, the valve V14b, the valve V11c, the valve V12c, the valve V14c, the valve V21, and the valve V22 are opened, and other valves of the plurality of valves of the piping system PS are closed. According to the control of the sixth mode, the heaters HN generate heat, the heat transfer gas is supplied to the heat transfer spaces DSN, and the refrigerant is supplied to the passage 34f. Accordingly, as the temporal change of the temperature of the attracting portion 52 of the electrostatic chuck 36 in a period T1 shown in FIG. 19, the temperature of the attracting portion 52 of the electrostatic chuck 36 increases at a relatively low rate. Therefore, according to the control of the sixth mode, it is possible to increase the temperature of the attracting portion 52 of the electrostatic chuck 36 at a relatively low temperature increase rate.

Figure 11:
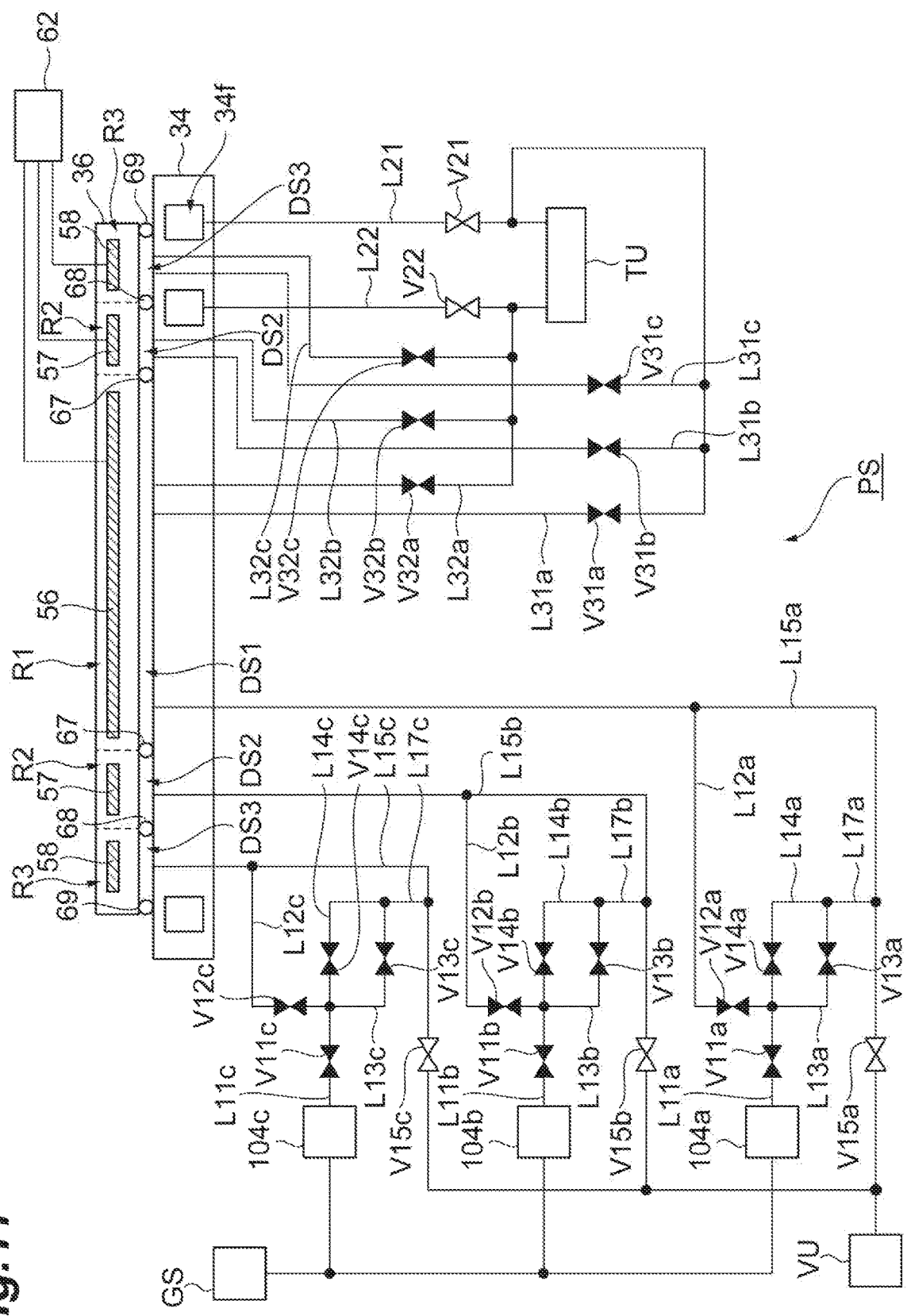
FIG. 11 is a view illustrating a state of the piping system.

As shown in FIG. 11, in a seventh mode, the heater power source 62 is controlled to supply power to the heaters HN. In addition, in the seventh mode, substantially the same power as the power supplied to the heaters HN in the sixth mode is supplied to the heaters HN. In addition, in the seventh mode, the valves of the piping system PS are controlled to circulate the refrigerant between the passage 34f and the chiller unit TU, and to connect the heat transfer spaces DSN to the exhaust device VU. In the example of the piping system PS shown in FIG. 11, in the seventh mode, the valve V15a, the valve V15b, the valve V15c, the valve V21, and the valve V22 are opened, and other valves of the plurality of valves of the piping system PS are closed. According to the control of the seventh mode, the heaters HN generate heat, the pressures of the heat transfer spaces DSN decrease, and the refrigerant is supplied to the passage 34f. Accordingly, as the temporal change of the temperature of the attracting portion 52 of the electrostatic chuck 36 in a period T4 shown in FIG. 19, the temperature of the attracting portion 52 of the electrostatic chuck 36 increases at a relatively high rate. Therefore, according to the control of the seventh mode, it is possible to increase the temperature of the attracting portion 52 of the electrostatic chuck 36 at a relatively high temperature increase rate.

Figure 12:
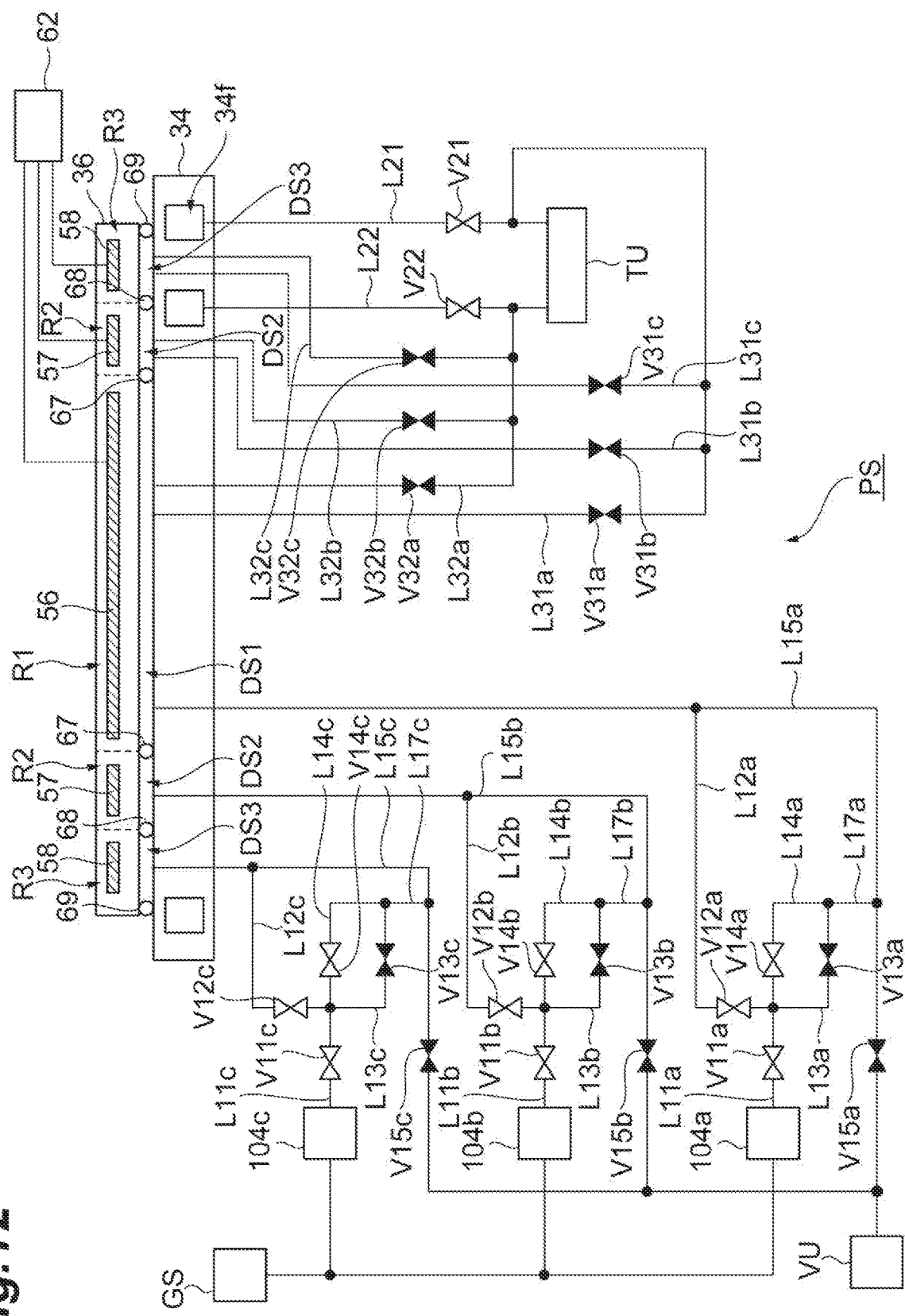
FIG. 12 is a view illustrating a state of the piping system.

As shown in FIG. 12, in an eighth mode, the heater power source 62 is controlled to shut-off supplying of power to the heaters HN. In addition, in the eighth mode, the valves of the piping system PS are controlled to circulate the refrigerant between the passage 34f and the chiller unit TU, and to connect the heat transfer spaces DSN to the gas source GS. In the example of the piping system PS shown in FIG. 12, in the eighth mode, the valve V11a, the valve V12a, the valve V14a, the valve V11b, the valve V12b, the valve V14b, the valve V11c, the valve V12c, the valve V14c, the valve V21, and the valve V22 are opened, and other valves of the plurality of valves of the piping system PS are closed. According to the control of the eighth mode, the heaters HN do not generate heat, the heat transfer gas is supplied to the heat transfer spaces DSN, and the refrigerant is supplied to the passage 34f. Accordingly, as the temporal change of the temperature of the attracting portion 52 of the electrostatic chuck 36 in a period T3 shown in FIG. 19, the temperature of the attracting portion 52 of the electrostatic chuck 36 decreases at a relatively low rate. Therefore, according to the control of the eighth mode, it is possible to decrease the temperature of the attracting portion 52 of the electrostatic chuck 36 at a relatively low temperature decrease rate.

Figure 13:
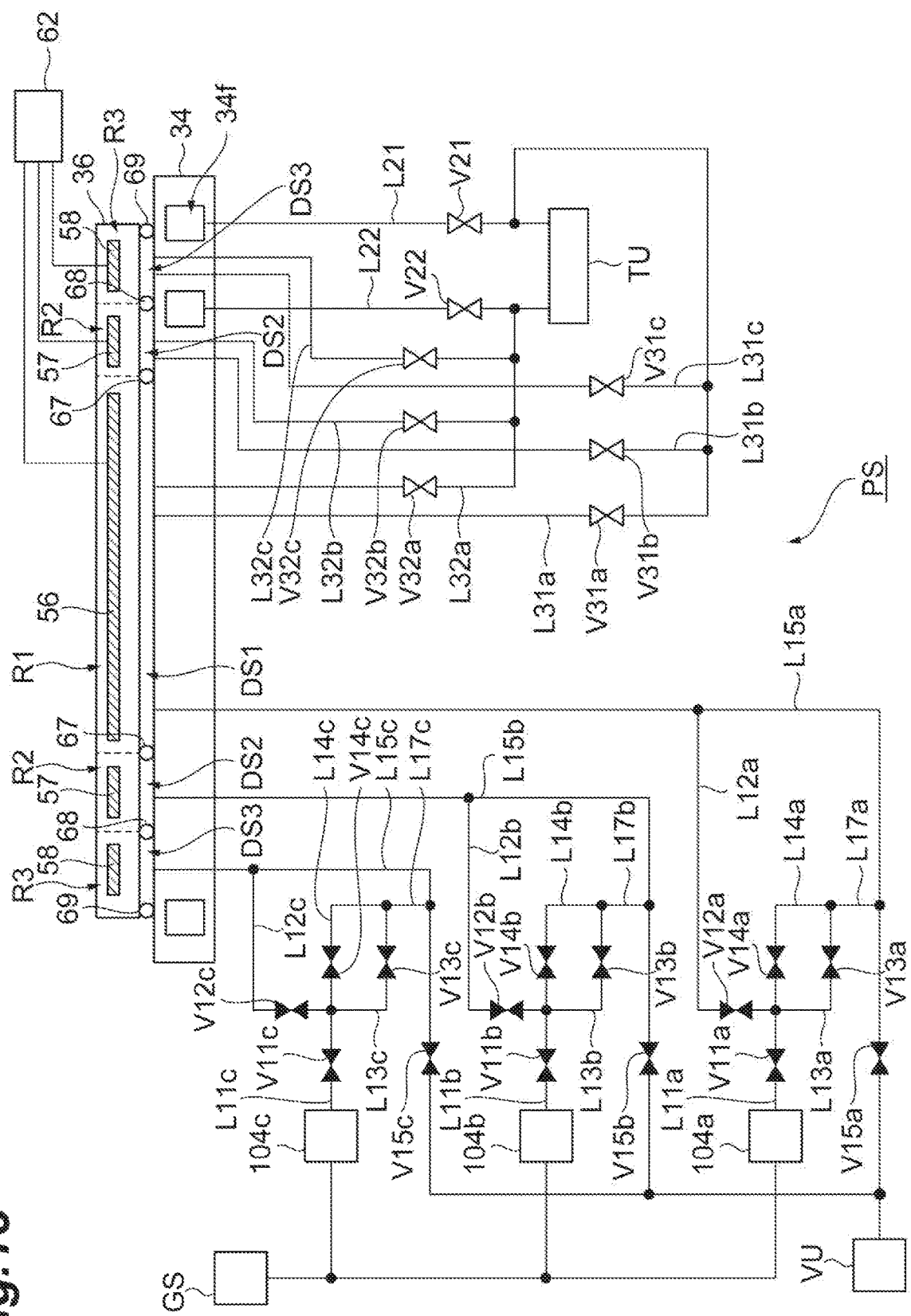
FIG. 13 is a view illustrating a state of the piping system.

As shown in FIG. 13, in a ninth mode, the heater power source 62 is controlled to shut-off supplying of power with respect to the heaters HN. In addition, in the ninth mode, the valves of the piping system PS are controlled to circulate the refrigerant between the passage 34f and the chiller unit TU, and to connect the heat transfer spaces DSN to the chiller unit TU. In the example of the piping system PS shown in FIG. 13, in the ninth mode, the valve V21, the valve V22, the valve V31a, the valve V32a, the valve V31b, the valve V32b, the valve V31c, and the valve V32c are opened, and other valves of the plurality of valves of the piping system PS are closed. According to the control of the ninth mode, the heaters HN do not generate heat, the refrigerant is supplied to the heat transfer spaces DSN, and the refrigerant is supplied to the passage 34f. Accordingly, as the temporal change of the temperature of the attracting portion 52 of the electrostatic chuck 36 in a period T5 shown in FIG. 19, the temperature of the attracting portion 52 of the electrostatic chuck 36 decreases at a relatively high rate. Therefore, according to the control of the ninth mode, it is possible to decrease the temperature of the attracting portion 52 of the electrostatic chuck 36 at a relatively high temperature decrease rate.

In the temporal change of the temperature of the attracting portion 52 of the electrostatic chuck 36 shown in FIG. 19, the control of the above-described first mode is used in a period T2 between the period T1 and the period T3. In addition, the control of the above-described second mode or third mode is used in a period T6. Moreover, the control of the above-described fourth mode is used in a period T7, and the control of the above-described fifth mode is used in a period T8. It should be noted that the series of the modes of the control performed by the controller MCU in order to obtain the temporal change in the temperature of the attracting portion 52 of the electrostatic chuck 36 shown in FIG. 19 is shown for only exemplification. The controller MCU can select the sixth mode or the seventh mode when increasing the temperature of the attracting portion 52 and can select the eighth mode or the ninth mode when decreasing the temperature of the attracting portion 52. In addition, when the temperature of the attracting portion 52 is relatively high, the controller MCU can select any one of the first to third modes, and when the temperature of the attracting portion 52 is relatively low, the controller MCU can select the fourth mode or the fifth mode.

Figure 20:
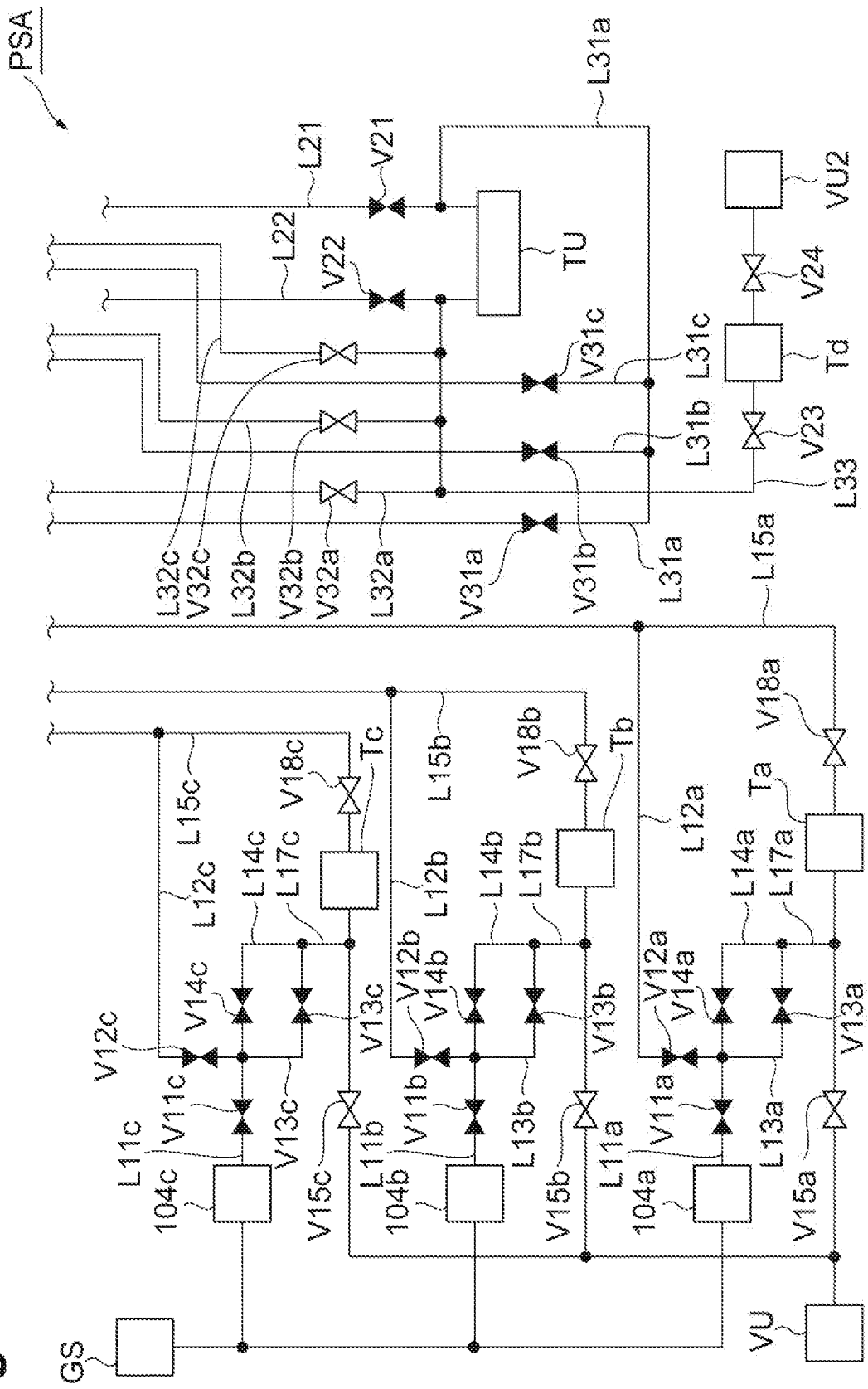
FIG. 20 is a view illustrating a configuration of a piping system according to another exemplary embodiment.

Hereinafter, a piping system according to another exemplary embodiment will be described. FIG. 20 is a view illustrating the configuration of the piping system according to another exemplary embodiment. A piping system PSA shown in FIG. 20 is a piping system which can be used in the processing apparatus 10 instead of the piping system PS. The piping system PSA is different from the piping system PS in that the piping system PSA further includes a valve V18a, a valve V18b, a valve V18c, a tank Ta, a tank Tb, a tank Tc, a pipe L33, a valve V23, a tank Td, and a valve V24.

The tank Ta is provided on the pipe L15a between a connection point between the pipe L17a and the pipe L15a and a connection point between the pipe L12a and the pipe L15a. The valve V18a is provided on the pipe L15a between a connection point between the pipe L12a and the pipe L15a and the tank Ta. The tank Tb is provided on the pipe L15b between a connection point between the pipe L17b and the pipe L15b and a connection point between the pipe L12b and the pipe L15b. The valve V18b is provided on the pipe L15b between a connection point between the pipe L12b and the pipe L15b and the tank Tb. The tank Tc is provided on the pipe L15c between a connection point between the pipe L17c and the pipe L15c and a connection point between the pipe L12c and the pipe L15c. The valve V18c is provided on the pipe L15c between a connection point between the pipe L12c and the pipe L15c and the tank Tc.

The pipe L33 is connected to the pipe L32a. The exhaust device VU2 is connected to the pipe L33. The valve V23 and the valve V24 are provided on the pipe L33. The tank Td is provided between the valve V23 and the valve V24.

As described above, in the piping system PS, it is possible to use the refrigerant which absorbs heat by vaporization thereof to perform cooling. Since the refrigerant is vaporized in the heat transfer spaces DSN, the refrigerant can be exhausted by the exhausted device VU. However, since a liquid refrigerant cannot flow to the exhaust device VU, it is not possible to use a liquid refrigerant in the piping system PS.

On the other hand, in the piping system PSA, it is possible to use a liquid refrigerant which is liquid in a use temperature range of the processing apparatus 10, for example, in a temperature zone from 20° C. to 250° C. In the piping system PSA, by closing the valve V11a, the valve V12a, the valve V13a, and the valve V14a and opening the valve V15a and the valve V18a, it is possible to collect a liquid refrigerant discharged from the first heat transfer space DS1 in the tank Ta. In addition, by closing the valve V11b, the valve V12b, the valve V13b, and the valve V14b and opening the valve V15b and the valve V18b, it is possible to collect a liquid refrigerant discharged from the second heat transfer space DS2 in the tank Tb. Moreover, by closing the valve V11c, the valve V12c, the valve V13c, and the valve V14c and opening the valve V15c and the valve V18c, it is possible to collect a liquid refrigerant discharged from the third heat transfer space DS3 in the tank Tc. In addition, by closing the valve V21, the valve V22, the valve V31a, the valve V31b, and the valve V31c and opening the valve V32a, the valve V32b, the valve V32c, the valve V23, and the valve V24, it is possible to collect a liquid refrigerant discharged from the first heat transfer space DS1, a liquid refrigerant discharged from the second heat transfer space DS2, and a liquid refrigerant discharged from the third heat transfer space DS3 in the tank Td.

In the above-described processing apparatus 10, each of the heat transfer spaces DSN may be depressurized, the heat transfer gas may be supplied to each of the heat transfer spaces DSN, or the refrigerant from the chiller unit may be supplied to each of the heat transfer spaces DSN. Accordingly, the thermal resistance between the cooling table 34 and the electrostatic chuck 36 can be changed. Therefore, a range of a settable temperature in the electrostatic chuck 36 (attracting portion 52) is wide. In addition, a range of a settable temperature increase rate in the electrostatic chuck 36 (attracting portion 52) and a range of a settable temperature decrease rate in the electrostatic chuck 36 (attracting portion 52) are wide. Moreover, by allowing the thermal resistances of the heat transfer spaces DSN to be different from each other, it is possible to set a temperature distribution which largely varies in the radial direction to the electrostatic chuck 36 (attracting portion 52). In addition, since it is possible to adjust the thermal resistance of each of the heat transfer spaces DSN, it is possible to set various temperature distributions to the electrostatic chuck 36 (attracting portion 52). For example, it is possible to set a temperature distribution in which a temperature steeply varies in the radial direction, a temperature distribution in which a temperature gently varies in the radial direction, or a temperature distribution in which a temperature is substantially constant in the radial direction to the electrostatic chuck 36 (attracting portion 52). Moreover, since it is possible to increase the thermal resistance between the cooling table 34 and the electrostatic chuck 36, it is possible to decrease power which is supplied to the heaters HN.

Hereinbefore, various embodiments are described. However, various modifications may be made without being limited to the above-described embodiments. For example, the high-frequency power source 42 may be connected to the upper electrode 16 via the matcher 46. In addition, the processing apparatus 10 may be an arbitrary plasma processing apparatus other than the capacitive coupling plasma processing apparatus, for example, an induction coupling plasma processing apparatus, a plasma processing apparatus in which surface waves such as microwaves are used to generate plasma, or other processing apparatus which processes the workpiece W.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus for a workpiece, comprising:
a chamber body; and
a pedestal provided inside the chamber body,
wherein the pedestal includes
a metal cooling table in which a passage for a refrigerant is formed, and
an electrostatic chuck provided above the cooling table,
wherein the electrostatic chuck includes a plurality of regions which are coaxial with respect to a center axis of the electrostatic chuck, and includes a plurality of heaters respectively provided in the plurality of regions, and
wherein a plurality of heat transfer spaces are provided to extend between the cooling table and the electrostatic chuck and extend below the plurality of regions, respectively, the heat transfer spaces being separated from each other,
the processing apparatus further comprising:
a heater power source connected to the plurality of heaters; and
a piping system including a plurality of valves which selectively connect a chiller unit, a gas source of a heat transfer gas, and an exhaust device to each of the plurality of heat transfer spaces and switch connection and disconnection between the chiller unit and the passage,
wherein the chiller unit is configured to circulate a refrigerant in the metal cooling table and the plurality of heat transfer spaces.

2. The processing apparatus according to claim 1, further comprising a controller which controls the plurality of valves and the heater power source,
wherein the plurality of regions includes a first region, a second region, and a third region, the first region intersects the center axis, the third region is a region which includes an edge of the electrostatic chuck, and the second region is provided between the first region and the third region,
wherein the plurality of heaters includes a first heater provided in the first region, a second heater provided in the second region, and a third heater provided in the third region, and
wherein the plurality of heat transfer spaces includes a first heat transfer space provided below the first region, a second heat transfer space provided below the second region, and a third heat transfer space provided below the third region.

3. The processing apparatus according to claim 2,
wherein the controller controls the heater power source to supply power to the plurality of heaters, and controls the plurality of valves to circulate a refrigerant between the passage and the chiller unit and connect the plurality of heat transfer spaces to the gas source.

4. The processing apparatus according to claim 2,
wherein the controller controls the heater power source such that a heating value of the first heater and a heating value of the second heater are greater than a heating value of the third heater, and controls the plurality of valves to circulate the refrigerant between the passage and the chiller unit, connect the first heat transfer space and the second heat transfer space to the gas source, and connect the third heat transfer space to the chiller unit.

5. The processing apparatus according to claim 2,
wherein the controller controls the heater power source such that a heating value of the second heater is greater than a heating value of the first heater and the heating value of the first heater is greater than a heating value of the third heater, and controls the plurality of valves to circulate the refrigerant between the passage and the chiller unit, connect the first heat transfer space and the second heat transfer space to the gas source, and connect the third heat transfer space to the chiller unit.

6. The processing apparatus according to claim 2,
wherein the controller controls the heater power source to supply power to the plurality of heaters, and controls the plurality of valves to connect the plurality of heat transfer spaces to the chiller unit.

7. The processing apparatus according to claim 2,
wherein the controller controls the heater power source such that a heating value of the first heater and a heating value of the second heater are greater than a heating value of the third heater, and controls the plurality of valves to connect the plurality of heat transfer spaces to the chiller unit.

8. The processing apparatus according to claim 2,
wherein the controller controls the heater power source to supply power to the plurality of heaters, and controls the plurality of valves to circulate the refrigerant between the passage and the chiller unit and connect the plurality of heat transfer spaces to the exhaust device.

9. The processing apparatus according to claim 2,
wherein the controller controls the heater power source to shut-off supplying of power to the plurality of heaters, and controls the plurality of valves to circulate the refrigerant between the passage and the chiller unit and connects the plurality of heat transfer spaces to the gas source.

10. The processing apparatus according to claim 2,
wherein the controller controls the heater power source to shut-off supplying of power to the plurality of heaters, and controls the plurality of valves to circulate the refrigerant between the passage and the chiller unit and connect the plurality of heat transfer spaces to the chiller unit.

11. The processing apparatus according to claim 1,
wherein the electrostatic chuck includes a conductive base and an attracting portion made of ceramics, and
wherein the attracting portion is provided on the base and the plurality of heaters are built in the attracting portion,
the processing apparatus further comprising:
a high-frequency power source electrically connected to the base; and
a gas supply unit which supplies a processing gas to the inside of the chamber body.

12. The processing apparatus according to claim 1,
wherein the electrostatic chuck is separated upward from the metal cooling table to provide the plurality of heat transfer spaces between the cooling table and the electrostatic chuck.

13. The processing apparatus according to claim 12, further comprising a plurality of elastic members provided between the cooling table and the electrostatic chuck to separate the electrostatic chuck upward from the cooling table, wherein the plurality of elastic members define the plurality of heat transfer spaces.

14. The processing apparatus according to claim 1,
wherein the piping system includes:
a first group of pipes connecting the gas source of the heat transfer gas to the plurality of heat transfer spaces; and
a second group of pipes connecting the chiller unit to the plurality of heat transfer spaces.

15. The processing apparatus according to claim 1, wherein the plurality of valves include a valve which switches connection and disconnection between the chiller unit and at least one of the plurality of heat transfer spaces.

* * * * *